(12) United States Patent
Higuchi et al.

(10) Patent No.: US 8,254,175 B2
(45) Date of Patent: Aug. 28, 2012

(54) SEMICONDUCTOR DEVICE AND METHOD OF MANUFACTURING THE SAME

(75) Inventors: Masaaki Higuchi, Yokohama (JP); Hiroshi Matsuba, Yokohama (JP); Yoshio Ozawa, Yokohama (JP); Tetsuya Kai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 12/638,836

(22) Filed: Dec. 15, 2009

(65) Prior Publication Data
US 2010/0157680 A1 Jun. 24, 2010

(30) Foreign Application Priority Data

Dec. 16, 2008 (JP) .................................. 2008-320103
Dec. 26, 2008 (JP) .................................. 2008-334636

(51) Int. Cl.
*G11C 11/34* (2006.01)
(52) U.S. Cl. .................... 365/185.18; 365/184; 257/324; 257/E29.309; 257/E21.021; 438/591; 438/478
(58) Field of Classification Search ............. 365/185.18, 365/184; 257/324, E29.309, E21.21; 438/591, 438/478
See application file for complete search history.

(56) References Cited

U.S. PATENT DOCUMENTS

2007/0018231 A1* 1/2007 Mitani et al. ................... 257/315
2007/0183208 A1   8/2007 Tanaka et al.

FOREIGN PATENT DOCUMENTS

| JP | 2004-158810 | 6/2004 |
| JP | 2006-216215 | 8/2006 |
| JP | 2007-324545 | 12/2007 |

* cited by examiner

*Primary Examiner* — Fernando Hidalgo
(74) *Attorney, Agent, or Firm* — Finnegan, Henderson, Farabow, Garrett & Dunner, L.L.P.

(57) ABSTRACT

A semiconductor device includes a semiconductor region, a tunnel insulating film formed on the semiconductor region, a charge-storage insulating film formed on the tunnel insulating film, a block insulating film formed on the charge-storage insulating film, and a control gate electrode formed on the block insulating film, wherein the tunnel insulating film comprises a first region which is formed on a surface of the semiconductor region and contains silicon and oxygen, a second region which contains silicon and nitrogen, a third region which is formed on a back surface of the charge-storage insulating film and contains silicon and oxygen, and an insulating region which is formed at least between the first region and the second region or between the second region and the third region, and contains silicon and nitrogen and oxygen and the second region is formed between the first region and the third region.

15 Claims, 30 Drawing Sheets

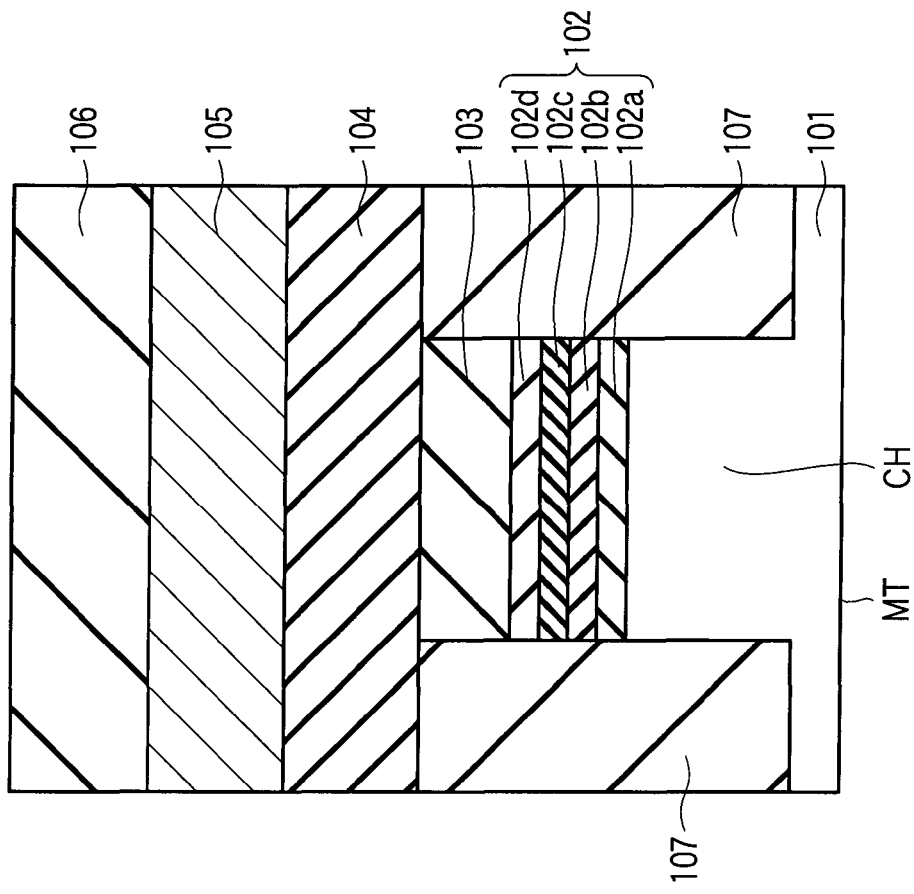
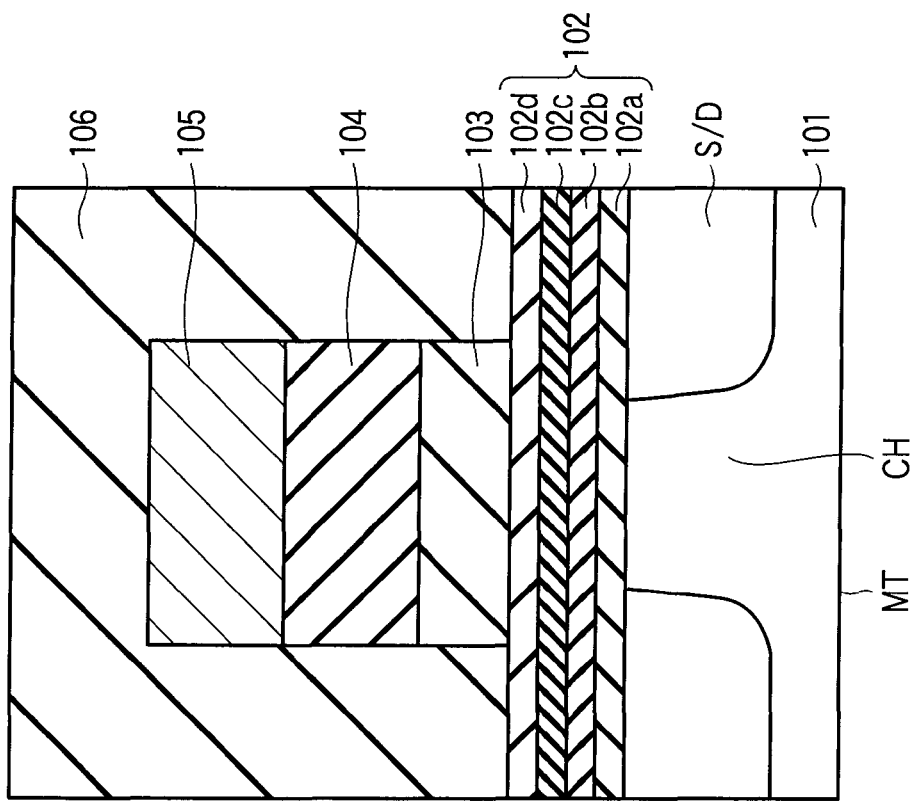

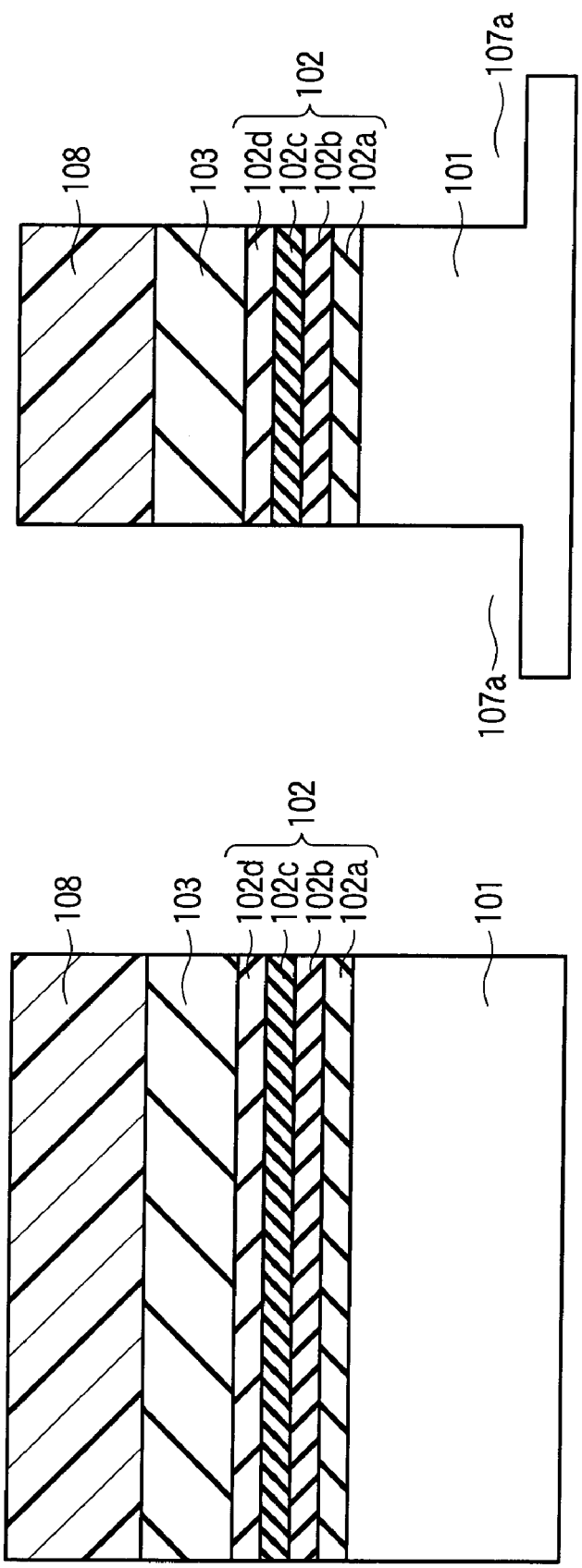

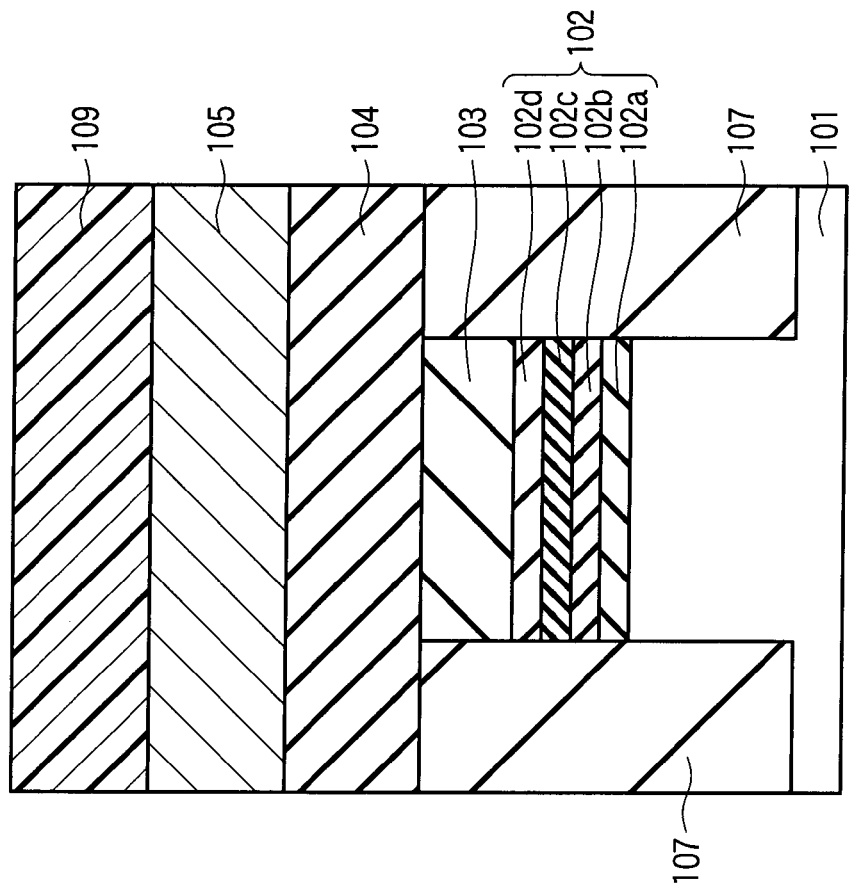
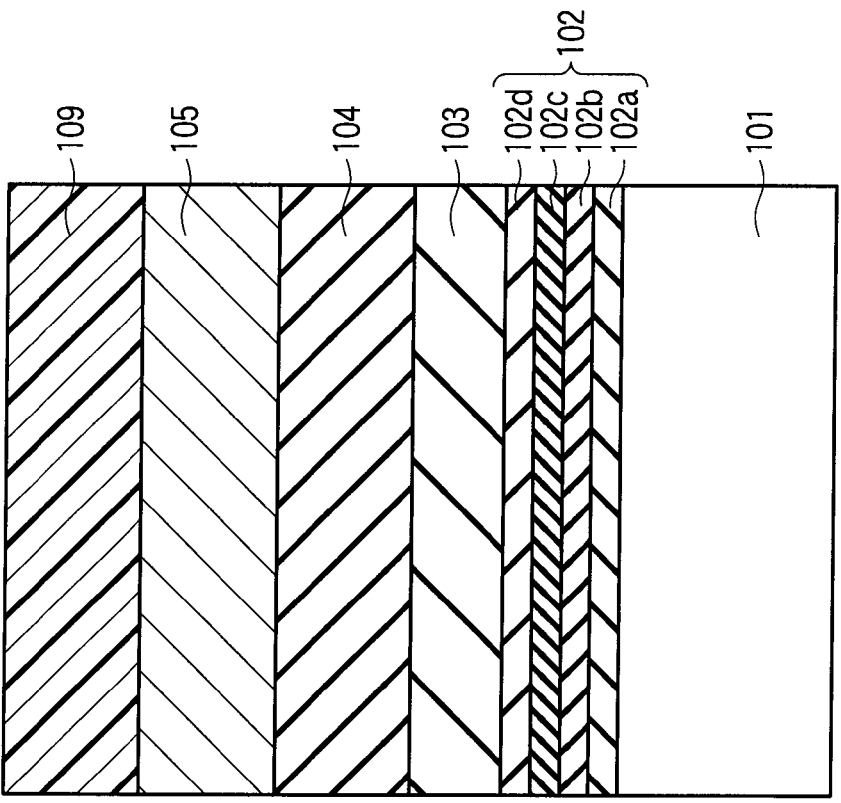

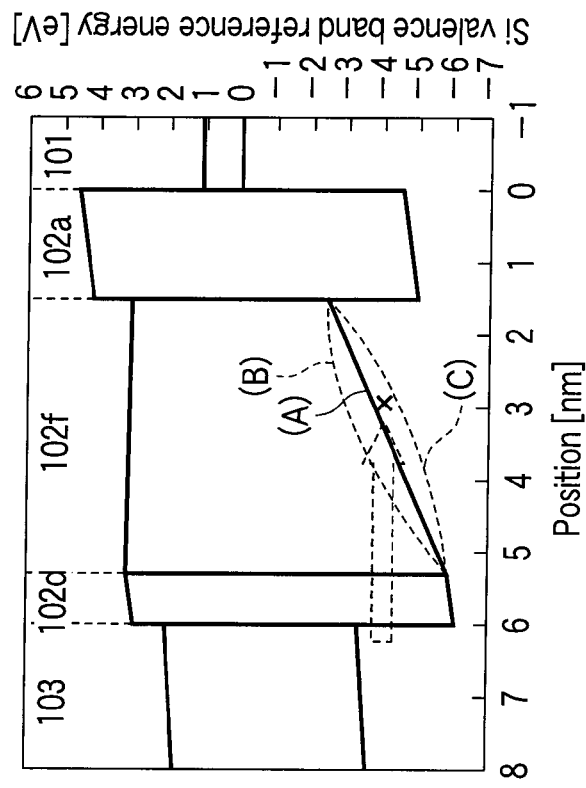
F I G. 9B
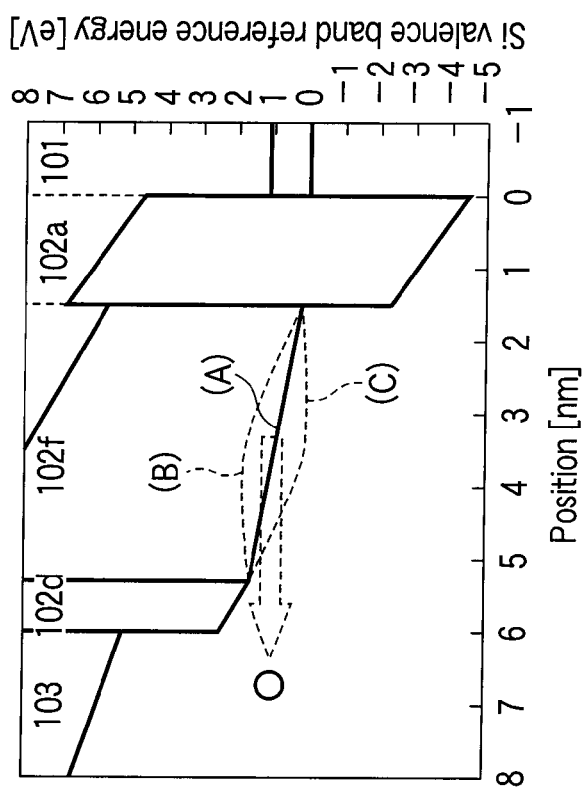
F I G. 9A

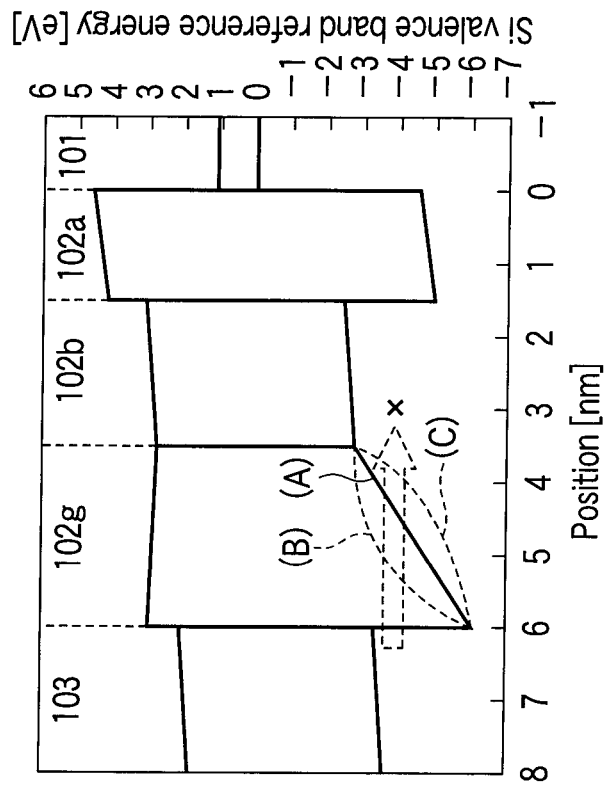
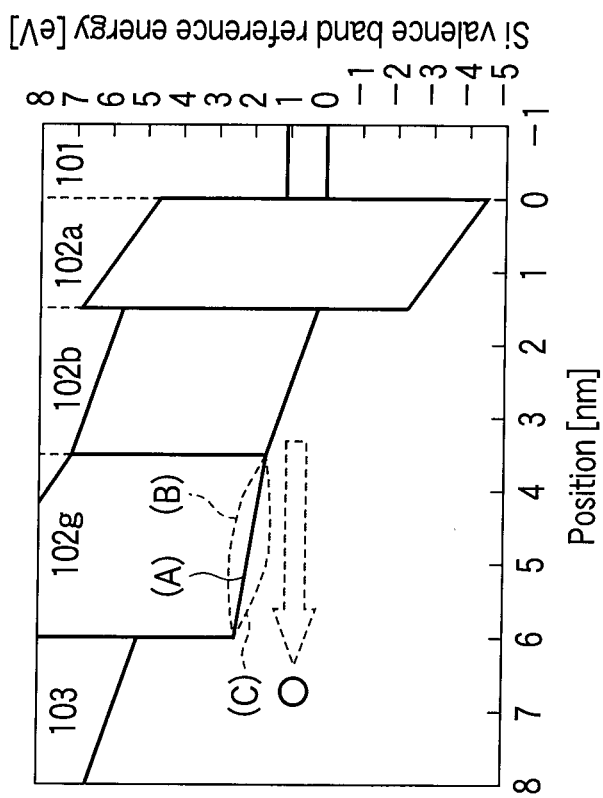
FIG. 11B
FIG. 11A

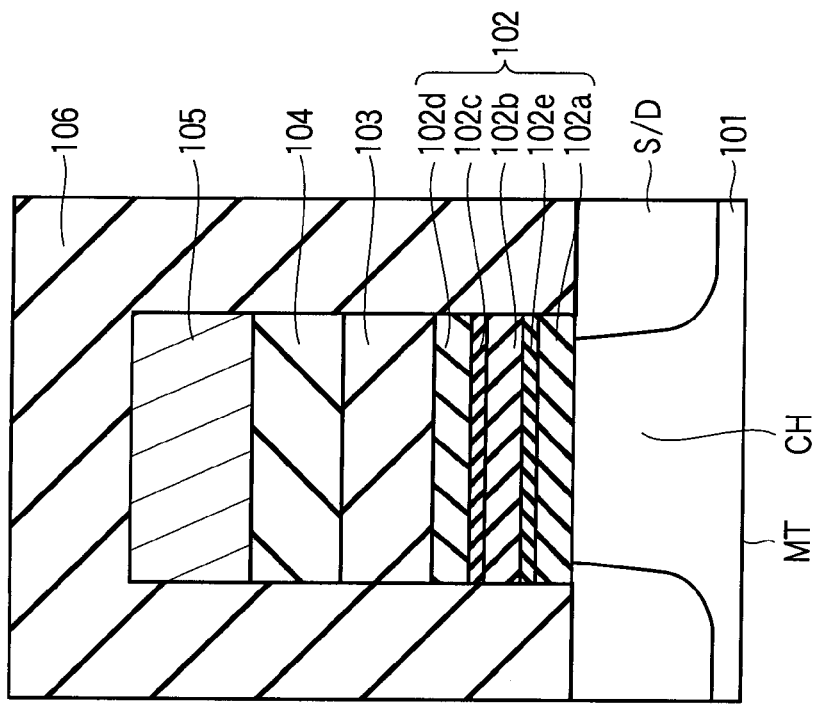
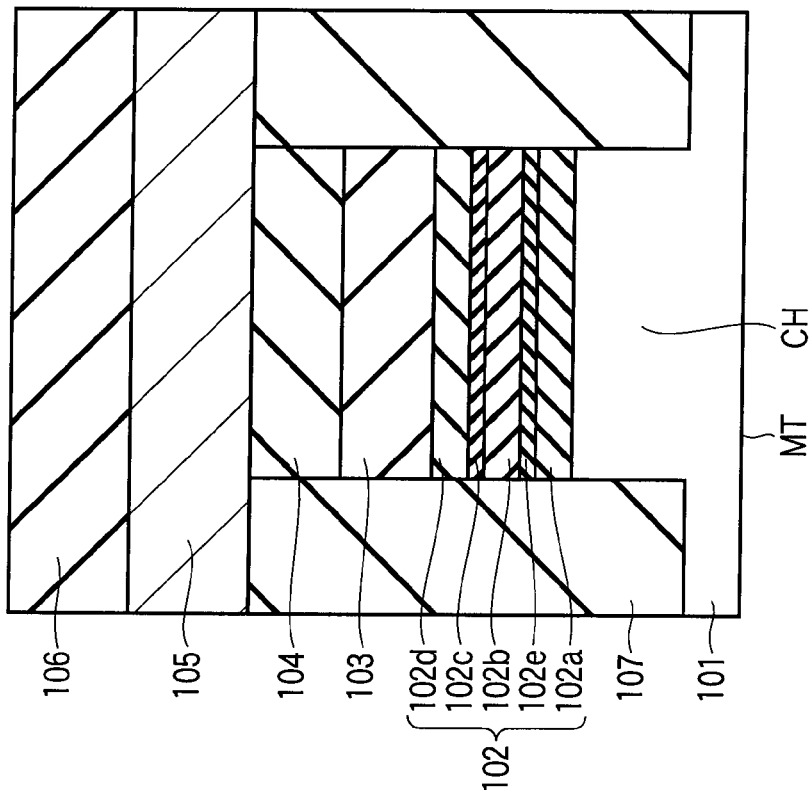
FIG. 14A
FIG. 14B

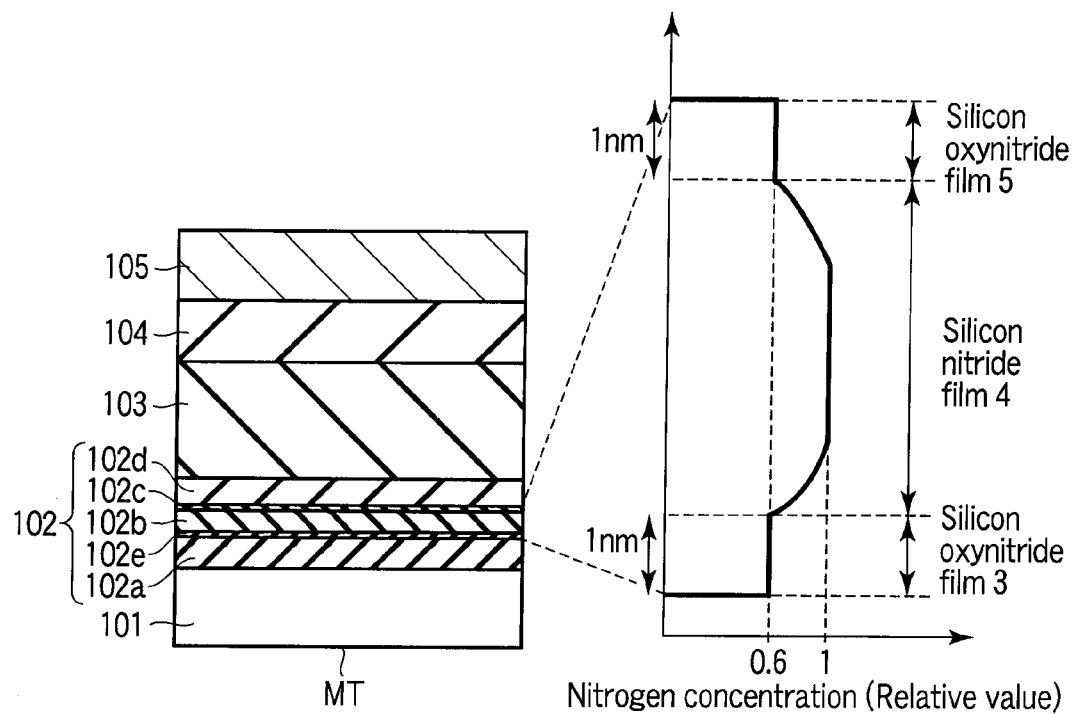
F I G. 15
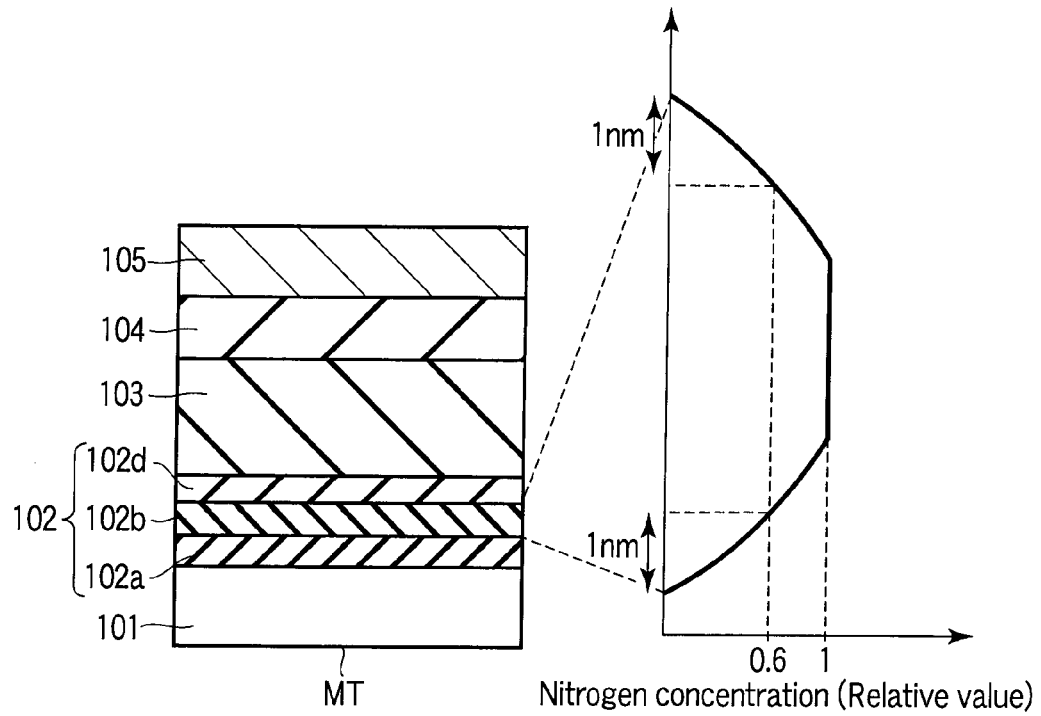
F I G. 16

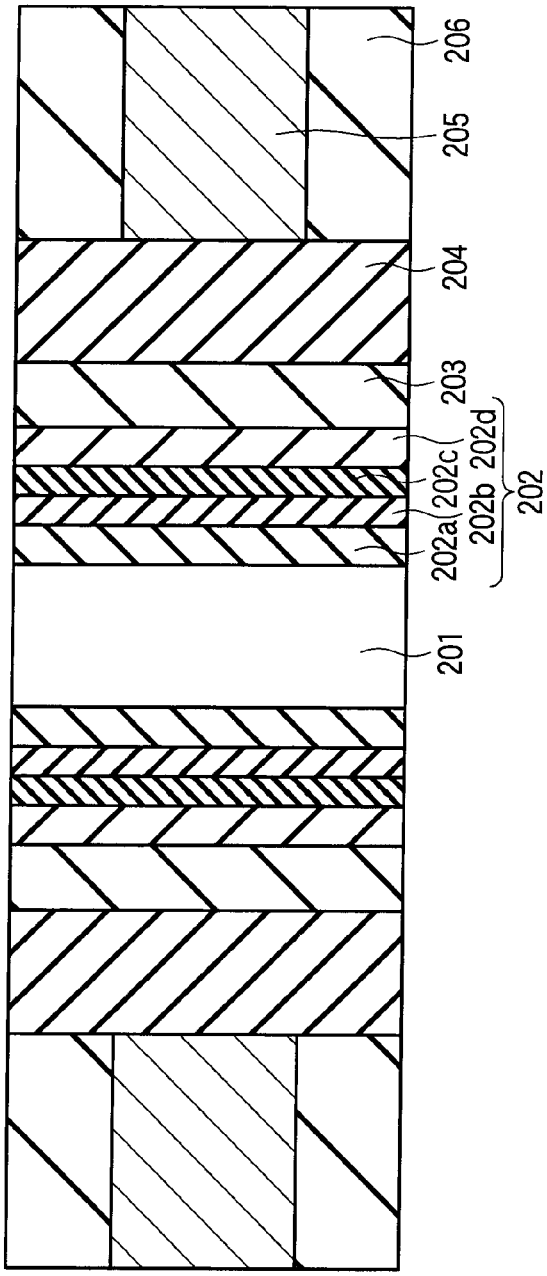
F I G. 17A
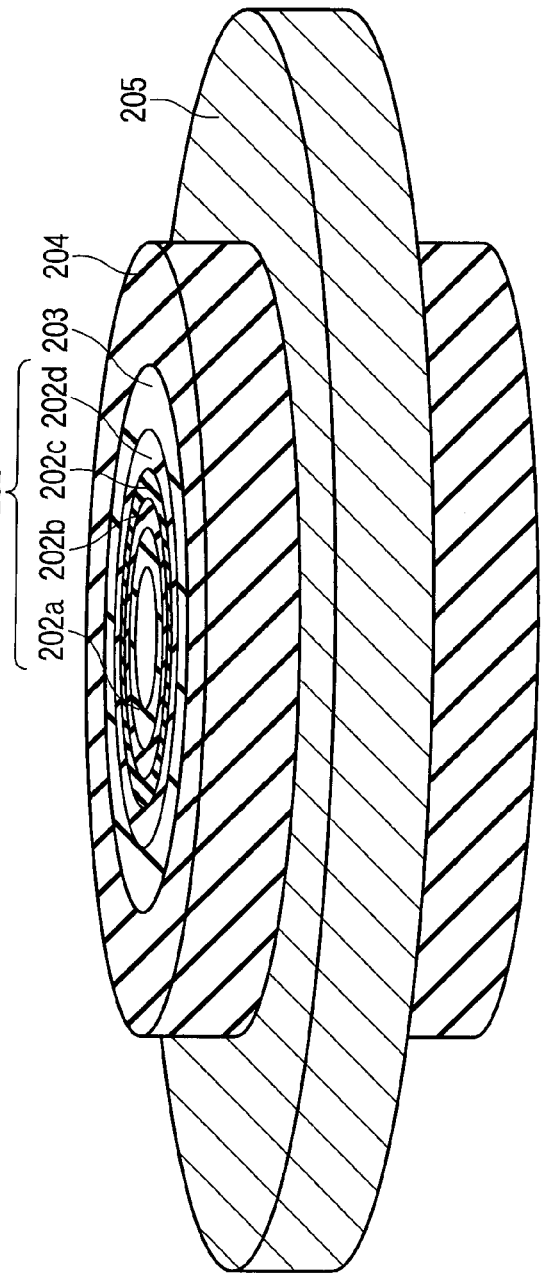
F I G. 17B

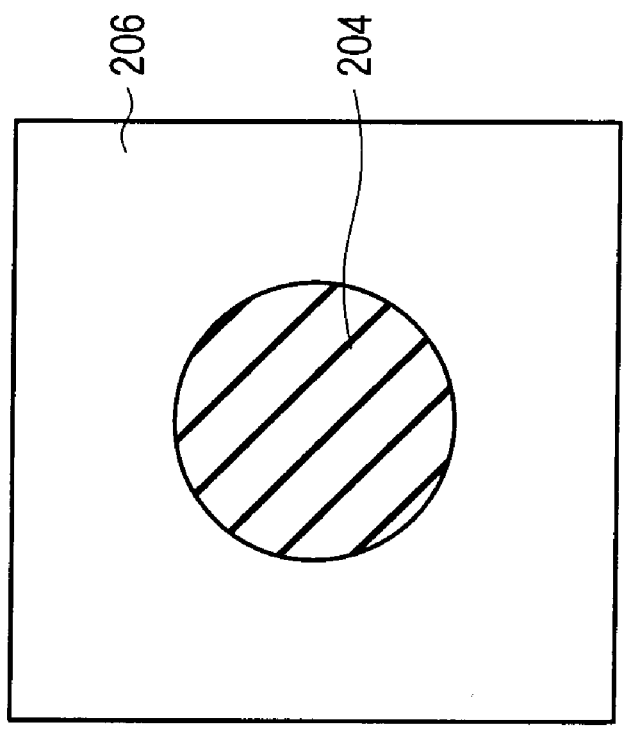
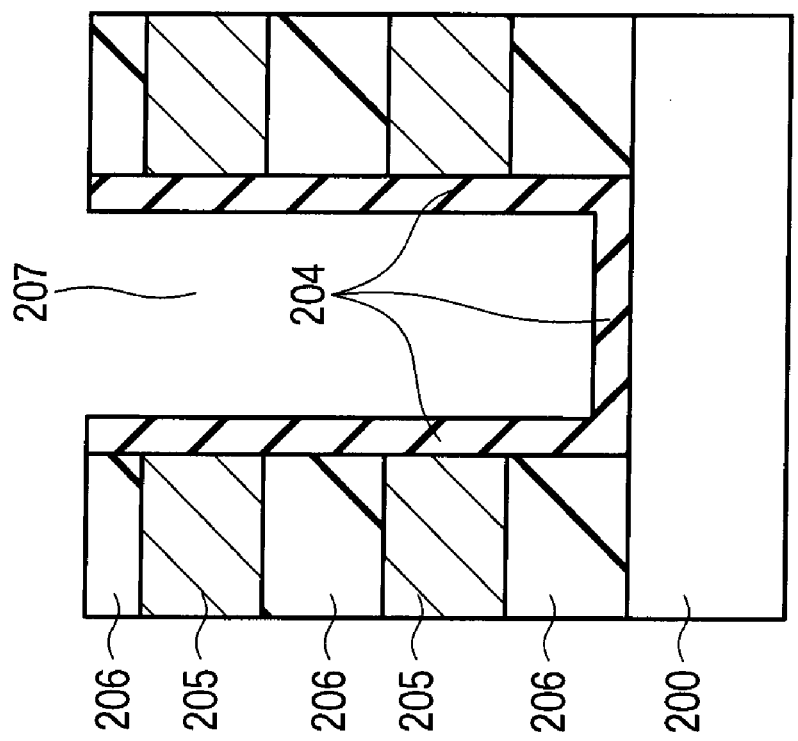
F I G. 20B
F I G. 20A

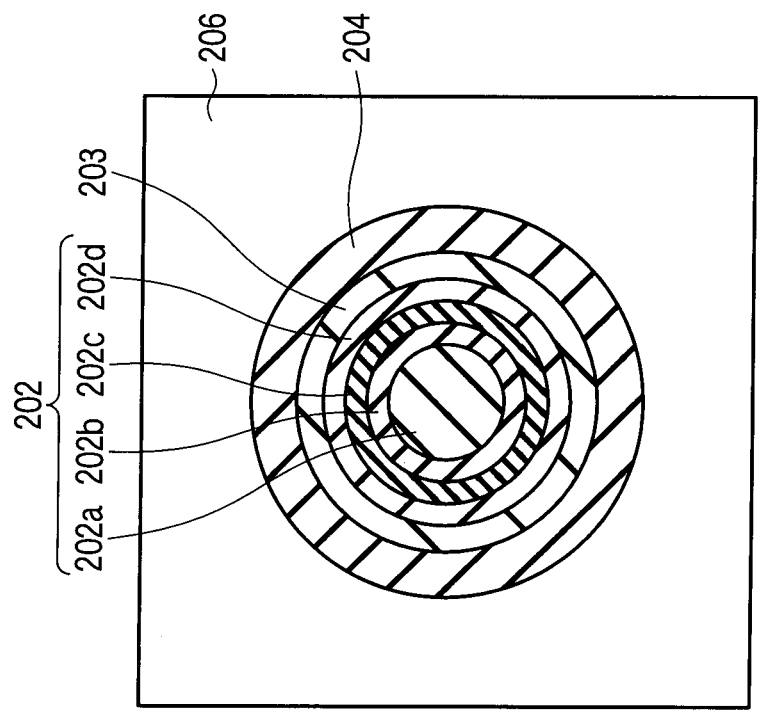
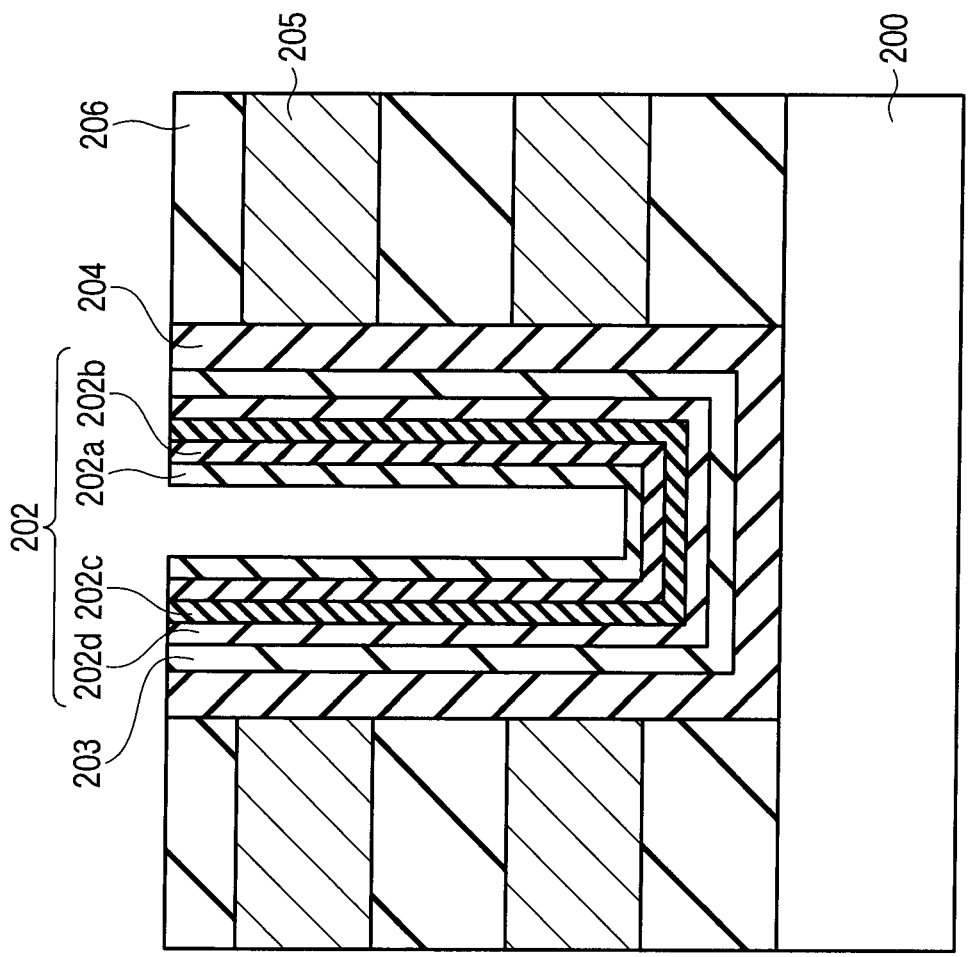
FIG. 21A
FIG. 21B

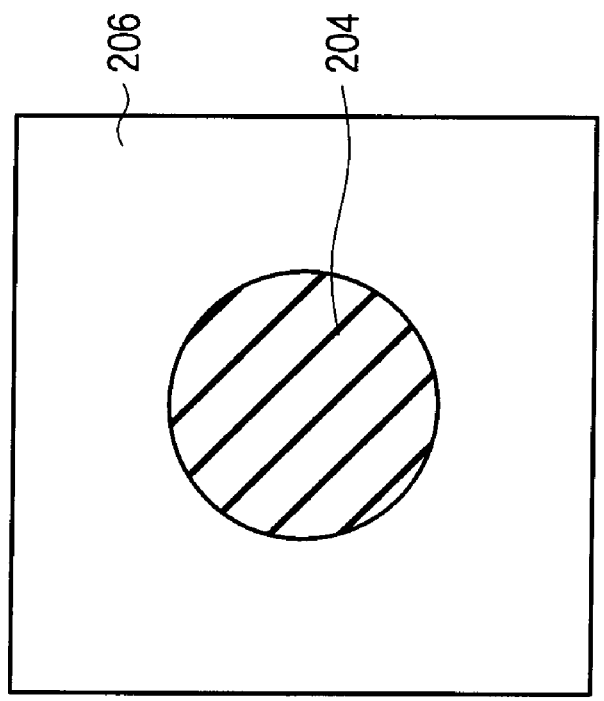
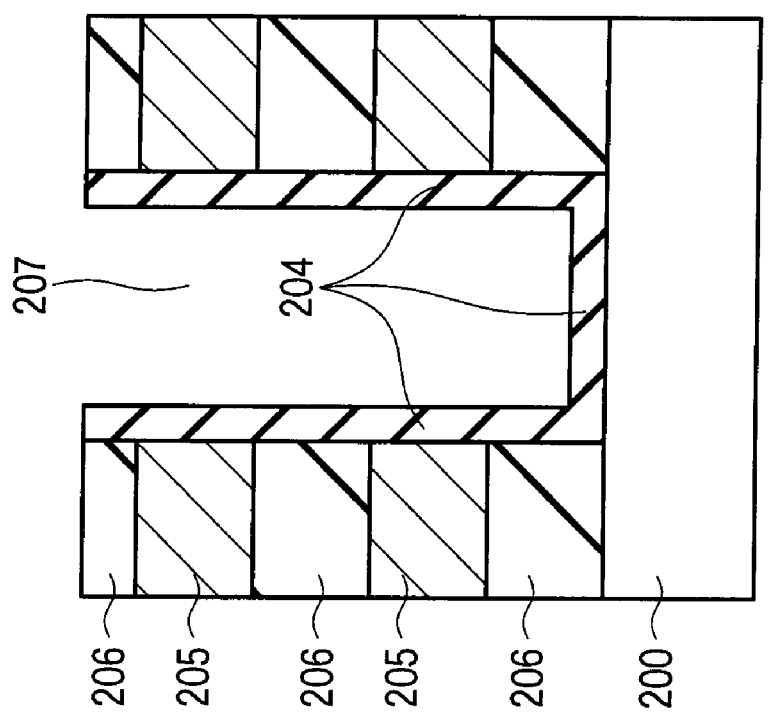
FIG. 25B
FIG. 25A

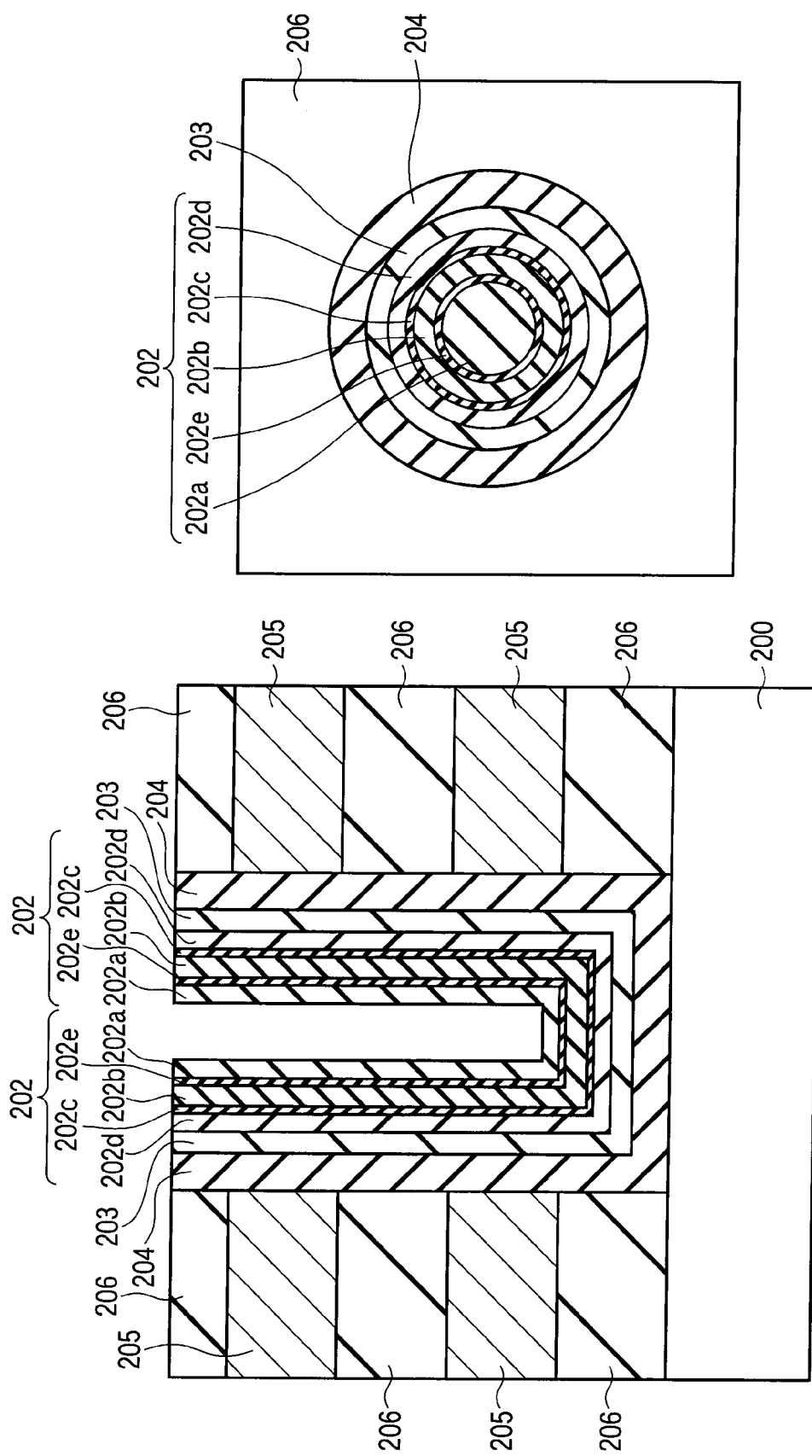
F I G. 26A
F I G. 26B

At time of positive bias application

At time of negative bias application

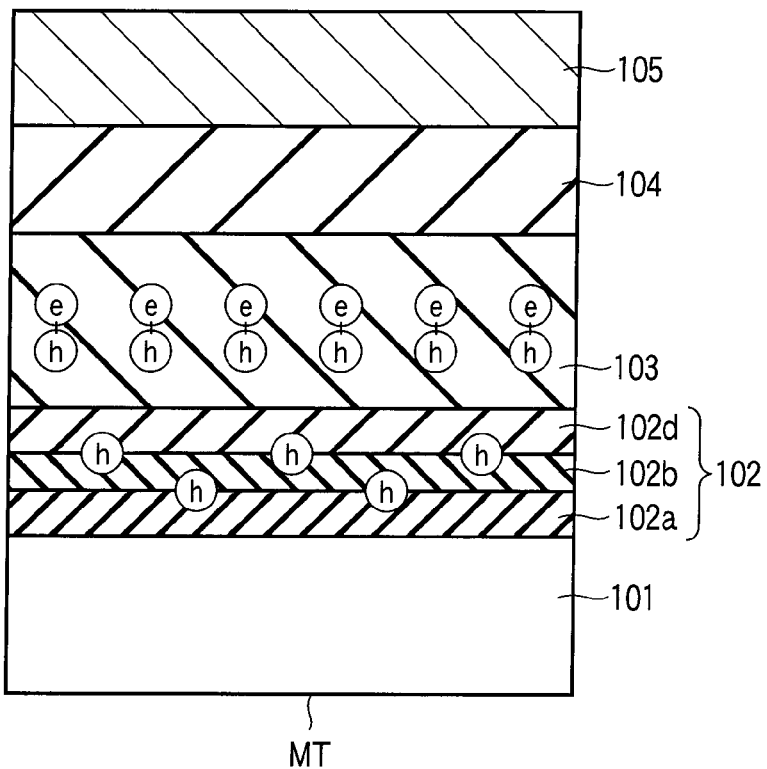
F I G. 32A
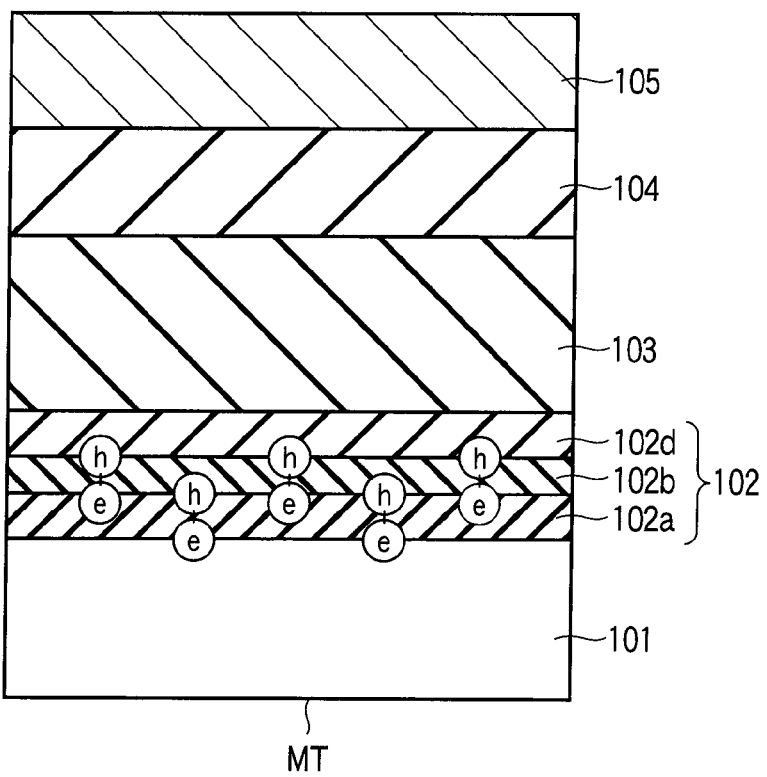
F I G. 32B

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Applications No. 2008-320103, filed Dec. 16, 2008; and No. 2008-334636, filed Dec. 26, 2008, the entire contents of both of which are incorporated herein by reference.

BACKGROUND OF THE INVENTION

1. Field of the Invention

The present invention relates to a semiconductor device and a method of manufacturing the semiconductor device.

2. Description of the Related Art

At present, there has been developed a charge-trap-type nonvolatile semiconductor memory device which uses, as a charge-storage layer, a charge-storage insulating film for charge trap (see, e.g. Jpn. Pat. Appln. KOKAI Publication No. 2004-158810). In this charge-trap-type nonvolatile semiconductor memory device, the charge, which has been injected in the charge-storage layer via a tunnel insulating film, is trapped at a trap level in the charge-storage insulating film, and thereby the charge is accumulated in the charge-storage insulating film. As a typical charge-trap-type nonvolatile semiconductor memory device, there is known a MONOS type or SONOS type nonvolatile semiconductor memory device, wherein a silicon nitride film, for instance, is used as the material of the charge-storage insulating film.

In the above-described charge-trap-type nonvolatile semiconductor memory device, there is proposed a tunnel insulating film having a multilayer structure (ONO structure) comprising a silicon oxide film, a silicon nitride film and a silicon oxide film, in order to increase the charge erase speed (see, e.g. Jpn. Pat. Appln. KOKAI Publication No. 2006-216215).

However, in the nonvolatile semiconductor memory device having the above structure, a defect occurs at the interface between the silicon nitride film and silicon oxide film due to a stress occurring from the differences in inter-lattice distance and film expansion coefficient between the silicon nitride film and silicon oxide film. This defect becomes a trap site of electrons and holes. The trapped electron or hole leaks into the semiconductor substrate, causing deterioration in charge retention characteristics of the charge-storage insulating film. Thus, it cannot necessarily be said that there has been proposed a nonvolatile semiconductor memory device having both excellent charge erase characteristics and excellent charge retention characteristics.

BRIEF SUMMARY OF THE INVENTION

According to a first aspect of the present invention, there is provided a semiconductor device comprising a semiconductor region, a tunnel insulating film formed on a surface of the semiconductor region, a charge-storage insulating film formed on a surface of the tunnel insulating film, a block insulating film formed on a surface of the charge-storage insulating film, and a control gate electrode formed on a surface of the block insulating film, wherein the tunnel insulating film comprises: a first region which is formed on the surface of the semiconductor region and contains at least one of silicon and germanium, and oxygen, as main components; a second region which contains at least one of silicon and germanium, and nitrogen, as main components; a third region which is formed on a back surface of the charge-storage insulating film and contains at least one of silicon and germanium, and oxygen, as main components; and an insulating region which is formed at least one of a region between the first region and the second region and a region between the second region and the third region, and contains at least one of silicon and germanium, nitrogen and oxygen, and the second region is formed between the first region and the third region.

According to a second aspect of the present invention, there is provided a semiconductor device comprising: a memory cell transistor including a semiconductor region, a tunnel insulating film formed on a surface of the semiconductor region, a charge-storage insulating film formed on a surface of the tunnel insulating film, a block insulating film formed on a surface of the charge-storage insulating film, and a control gate electrode formed on a surface of the block insulating film; and a control circuit configured to control the memory cell transistor, wherein the tunnel insulating film comprises: a first region which is formed on the surface of the semiconductor region and contains at least one of silicon and germanium, and oxygen, as main components; a second region which contains at least one of silicon and germanium, and nitrogen, as main components; and a third region which is formed on a back surface of the charge-storage insulating film and contains at least one of silicon and germanium, and oxygen, as main components, and the second region is formed between the first region and the third region, and the control circuit is configured to apply a first voltage, which is a positive bias, to the control gate electrode, and thereafter to apply a second voltage, which is a negative bias and has a smaller absolute value than the first voltage, to the control gate electrode, in a write operation comprising a series of operations of applying the first voltage and the second voltage, and configured to apply a third voltage, which is a negative bias, to the control gate electrode, and thereafter to apply a fourth voltage, which is a positive bias and has a smaller absolute value than the third voltage, to the control gate electrode, in an erase operation comprising a series of operations of applying the third voltage and the fourth voltage.

According to a third aspect of the present invention, there is provided a method of manufacturing a semiconductor device comprising a semiconductor region, a tunnel insulating film formed on a surface of the semiconductor region, a charge-storage insulating film formed on a surface of the tunnel insulating film, a block insulating film formed on a surface of the charge-storage insulating film, and a control gate electrode formed on a surface of the block insulating film, wherein the tunnel insulating film comprises a first region which is formed on the surface of the semiconductor region and contains at least one of silicon and germanium, and oxygen, as main components; a second region which contains at least one of silicon and germanium, and nitrogen, as main components; a third region which is formed on a back surface of the charge-storage insulating film and contains at least one of silicon and germanium, and oxygen, as main components; and an insulating region which is formed at least one of a region between the first region and the second region and a region between the second region and the third region, and contains at least one of silicon and germanium, nitrogen and oxygen, the insulating region having a lower nitrogen concentration than the second region and a lower oxygen concentration than the third region, and a formation of the insulating region is performed at least one of a formation between a formation of the first region and a formation of the second region, and a formation between a formation of the second region and a formation of the third region.

BRIEF DESCRIPTION OF THE SEVERAL VIEWS OF THE DRAWING

FIG. 1A is a cross-sectional view taken in a channel length direction (bit line direction) of a memory cell transistor of a flash memory according to a first embodiment of the present invention, and FIG. 1B is a cross-sectional view taken in a channel width direction (word line direction) of the memory cell transistor of the flash memory according to the first embodiment;

FIG. 5A is a cross-sectional view taken along the bit line direction of the semiconductor device according to the first embodiment of the invention, and FIG. 5B is a cross-sectional view taken along the word line direction of the semiconductor device according to the first embodiment of the invention;

FIG. 6A is a cross-sectional view taken along the bit line direction of the semiconductor device according to the first embodiment of the invention, and FIG. 6B is a cross-sectional view taken along the word line direction of the semiconductor device according to the first embodiment of the invention;

FIG. 9A is an energy band diagram at a time of a charge erase operation of the memory cell transistor of Modification 1 of the first embodiment of the invention, and FIG. 9B is an energy band diagram at a time after the charge erase of the memory cell transistor of Modification 1 of the first embodiment of the invention;

FIG. 11A is an energy band diagram at a time of a charge erase operation of the memory cell transistor of Modification 2 of the first embodiment of the invention, and FIG. 11B is an energy band diagram at a time after the charge erase of the memory cell transistor of Modification 2 of the first embodiment of the invention;

FIG. 14A is a cross-sectional view taken in the bit line direction of a memory cell transistor of a flash memory according to a second embodiment of the present invention, and FIG. 14B is a cross-sectional view taken in the word line direction of the memory cell transistor of the flash memory according to the second embodiment;

FIG. 15 shows a cross-sectional view of a tunnel insulating film in the second embodiment of the invention, and a nitrogen concentration distribution in the depth direction of an oxynitride film, a nitride film and an oxynitride film;

FIG. 16 shows a cross-sectional view of a tunnel insulating film of a comparative example of the second embodiment of the invention, and a nitrogen concentration distribution in the depth direction of a nitride film;

FIG. 17A is a cross-sectional view taken in the channel length direction of a memory cell transistor according to a third embodiment of the present invention, and FIG. 17B is a perspective view of the memory cell transistor according to the third embodiment of the invention;

FIG. 20A is a cross-sectional view taken along the channel length direction of the semiconductor device according to the third embodiment of the invention, and FIG. 20B is a cross-sectional view taken along a direction perpendicular to the channel length direction of the semiconductor device according to the third embodiment of the invention;

FIG. 21A is a cross-sectional view taken along the channel length direction of the semiconductor device according to the third embodiment of the invention, and FIG. 21B is a cross-sectional view taken along a direction perpendicular to the channel length direction of the semiconductor device according to the third embodiment of the invention;

FIG. 25A is a cross-sectional view taken along the channel length direction of the semiconductor device according to the fourth embodiment of the invention, and FIG. 25B is a cross-sectional view taken along a direction perpendicular to the channel length direction of the semiconductor device according to the fourth embodiment of the invention;

FIG. 26A is a cross-sectional view taken along the channel length direction of the semiconductor device according to the fourth embodiment of the invention, and FIG. 26B is a cross-sectional view taken along a direction perpendicular to the channel length direction of the semiconductor device according to the fourth embodiment of the invention;

FIG. 32A is a cross-sectional view for explaining the operation of the memory cell transistor in the flash memory according to the fifth embodiment of the invention, and FIG. 32B is a cross-sectional view for explaining the operation of the memory cell transistor in the flash memory according to the fifth embodiment of the invention, which follows the operation shown in FIG. 32A.

DETAILED DESCRIPTION OF THE INVENTION

Figure 2:
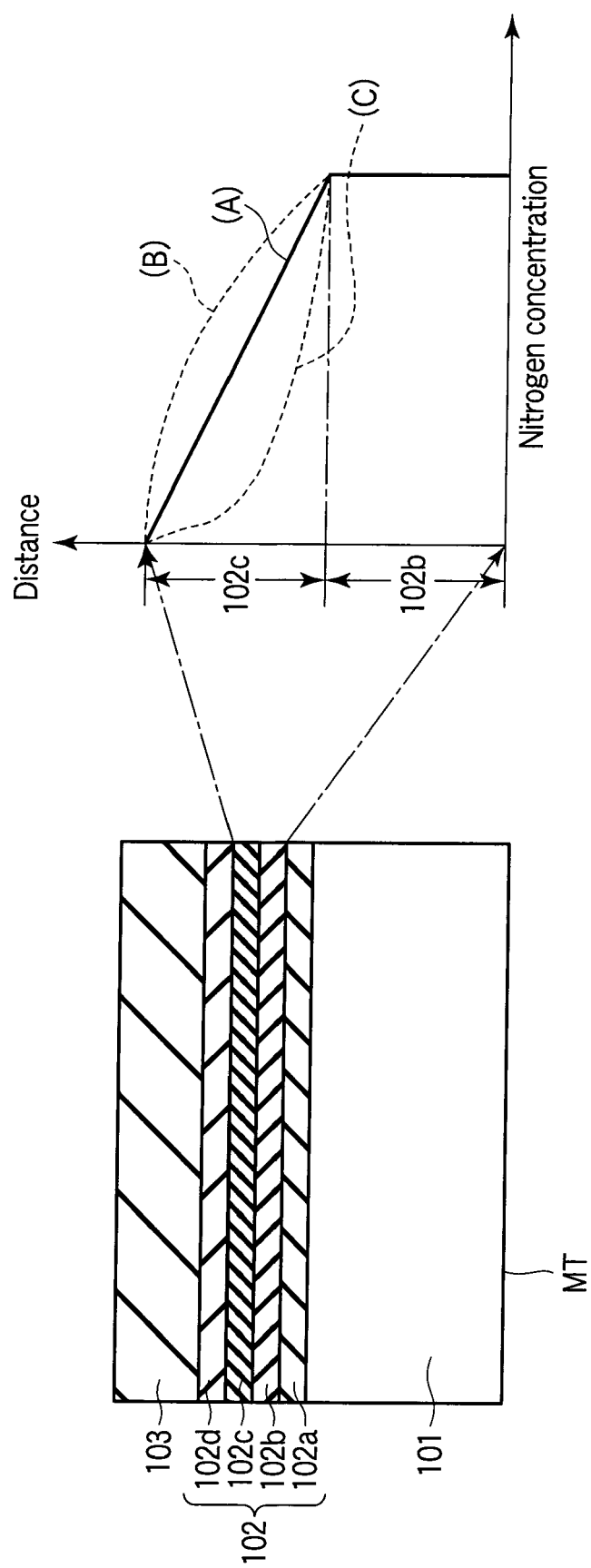
FIG. 2 shows a cross-sectional view of a tunnel insulating film in the first embodiment of the invention, and a nitrogen concentration distribution in the depth direction of a nitride film and an oxynitride film.

Semiconductor devices according to embodiments of the present invention (charge-trap-type nonvolatile semiconductor memory devices using, as charge-storage layers, charge-storage insulating films for charge trap) will now be described. The semiconductor devices according to the embodiments may be of a NAND type or a NOR type, and these semiconductor devices are applied, in particular, to a MONOS structure.

First Embodiment

Referring to FIG. 1A, FIG. 1B, FIG. 2, FIG. 3A, FIG. 3B and FIG. 3C, a description is given of the outline of the basic structure of a semiconductor device according to a first embodiment of the invention.

First, the structure of a memory cell transistor of a flash memory according to the first embodiment is described. FIG. 1A is a cross-sectional view taken in a channel length direction (bit line direction) of the memory cell transistor of the flash memory according to the first embodiment of the present invention, and FIG. 1B is a cross-sectional view taken in a channel width direction (word line direction) of the memory cell transistor of the flash memory according to the first embodiment.

As shown in FIG. 1A and FIG. 1B, a tunnel insulating film 102 is formed on the surface of a semiconductor substrate (silicon substrate) 101. A charge-storage insulating film 103 is formed on a surface of the tunnel insulating film 102. A block insulating film 104 is formed on the surface of the charge-storage insulating film 103, and a control gate electrode 105 is formed on the surface of the block insulating film 104. A gate voltage for data write, erase and read of the memory cell transistor MT is applied to the control gate electrode 105. An interlayer insulating film 106 is formed so as to cover the memory cell transistor MT. In addition, an element isolation insulating film 107 is formed between memory cell transistors MT which neighbor in the word line direction. A channel region CH is formed on a surface of the semiconductor substrate 101, which is sandwiched between the element isolation insulating films 107.

The tunnel insulating film 102 comprises an oxide film (first region) 102a which is formed on the surface of the semiconductor substrate 101; a nitride film (second region) 102b which is formed on the surface of the oxide film 102a; an oxynitride film (fourth region) 102c which is formed on the surface of the nitride film 102b; and an oxide film (third region) 102d which is formed on the surface of the oxynitride film 102c.

Each of the oxide film 102a and oxide film 102d is, for instance, a silicon oxide film containing silicon and oxygen as main components. The nitride film 102b is, for instance, a silicon nitride film containing silicon and nitrogen as main components. The oxynitride film 102c is, for instance, a silicon oxynitride film containing silicon, nitrogen and oxygen as main components.

FIG. 2 shows a cross-sectional view of the tunnel insulating film 102 in the first embodiment, and a nitrogen concentration distribution in the depth direction of the nitride film 102b and the oxynitride film 102c.

As shown in FIG. 2, the nitrogen concentration in the oxynitride film 102c decreases from the boundary between the nitrogen film 102b and the oxynitride film 102c toward the boundary between the oxide film 102d and the oxynitride film 102c. Conversely, the oxygen concentration increases from the boundary between the nitrogen film 102b and the oxynitride film 102c toward the boundary between the oxide film 102d and the oxynitride film 102c. A nitrogen concentration distribution (A) is a distribution in the case where the nitrogen concentration decreases at a constant ratio. A distribution (B) is a distribution in the case where the quantity of nitrogen is greater and the quantity of oxygen is smaller than in the case of the distribution (A). A distribution (C) is a distribution in the case where the quantity of nitrogen is smaller and the quantity of oxygen is greater than in the case of the distribution (A).

Figure 3A:
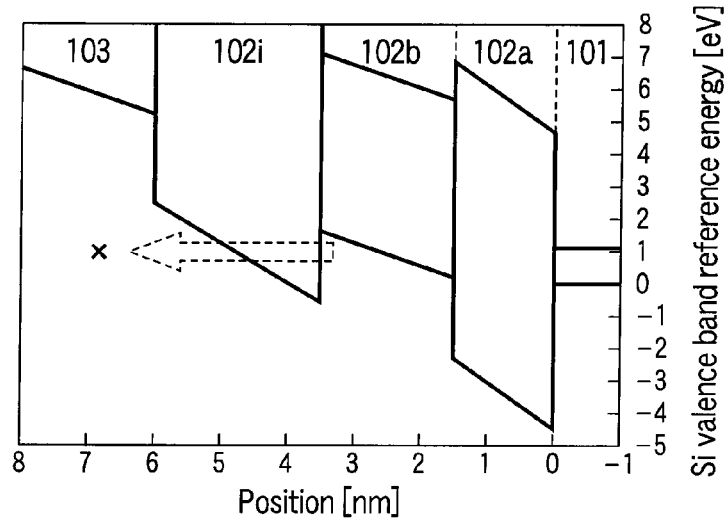
FIG. 3A is an energy band diagram at a time of a charge erase operation of a memory cell transistor of a comparative example of the first embodiment of the invention.
Figure 3B:
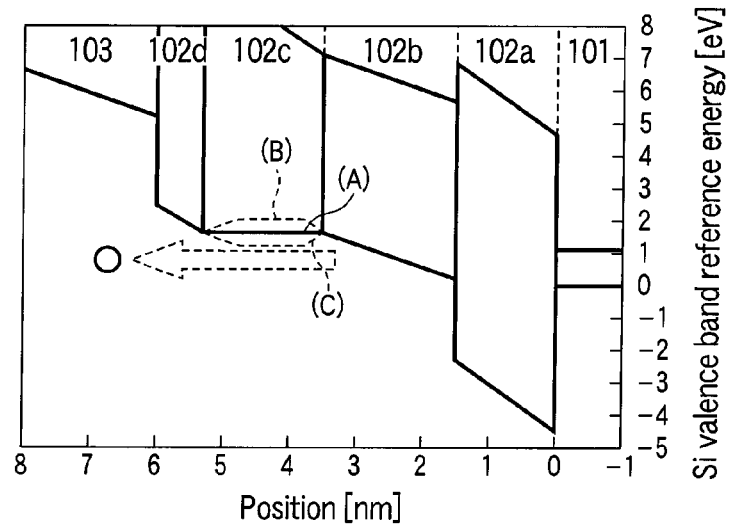
FIG. 3B is an energy band diagram at a time of a charge erase operation of the memory cell transistor of the first embodiment of the invention.
Figure 3C:
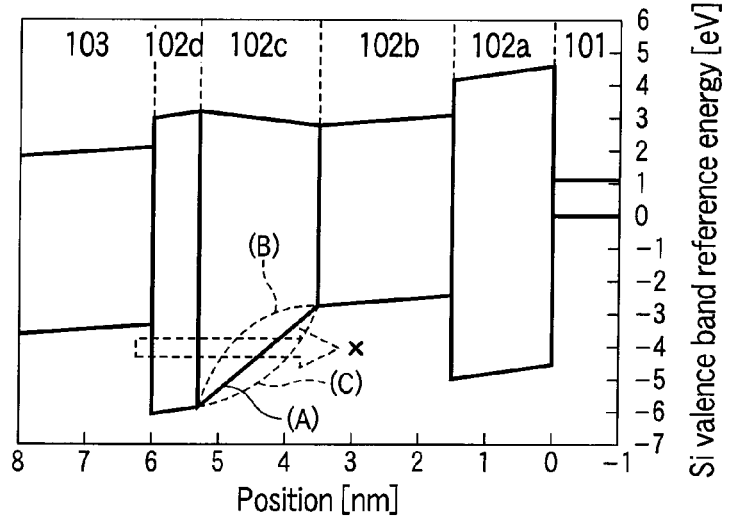
FIG. 3C is an energy band diagram at a time after the charge erase operation of the memory cell transistor of the first embodiment of the invention.

FIG. 3A is an energy band diagram at a time of a charge erase operation of a memory cell transistor of a comparative example (a tunnel insulating film has an ONO structure). FIG. 3B is an energy band diagram at a time of a charge erase operation of the memory cell transistor of the first embodiment. FIG. 3C is an energy band diagram at a time after the charge erase (at a time of charge retention) of the memory cell transistor of the first embodiment.

As shown in FIG. 3A, in the case where the tunnel insulating film 102 has an ONO structure comprising an oxide film 102a, a nitride film 102b and an oxide film 102i, the energy barrier against holes is higher at the end of the valence band of the oxide film 102i than the end of the valence band of the nitride film 102b. Thus, at the time of the charge erase operation (at the time of hole injection), the injection of holes in the charge-storage film 103 is blocked by the barrier of the oxide film 102i against the hole. As a result, the holes are trapped in the potential well of the nitride film 102b.

In the tunnel insulating film 102 of the present embodiment, the oxynitride film 102c is formed between the nitride film 102b and oxide film 102d. Thus, as shown in FIG. 3B, holes are injected in the charge-storage insulating film 103, without being blocked by the barrier, and the holes are not trapped in the tunnel insulating film 102. As a result, the saturation of erase characteristics due to the hole trap can be suppressed, and good erase characteristics can be obtained.

In addition, in the present embodiment, as shown in FIG. 3C, at the time of charge retention, the oxynitride film 102c and oxide film 102d function as a barrier against holes, and therefore the degradation in charge retention characteristics can be suppressed.

As a result, in the present embodiment, it is possible to obtain the memory cell transistor having good charge erase characteristics and charge retention characteristics.

As shown in FIG. 3B and FIG. 3C, in the case of (B) (corresponding to (B) in FIG. 2), the barrier against holes from the low electric field side becomes small at the time of the erase operation, and thereby the erase speed is improved. In the case of (C) (corresponding to (C) in FIG. 2), the energy barrier on the tunnel insulating film 102 side against the holes accumulated in the charge-storage insulating film 103 becomes higher, and thereby the charge retention characteristics at the time of erase are improved.

Next, referring to FIG. 1A, FIG. 1B, and FIG. 4A and FIG. 4B through FIG. 7A and FIG. 7B, a basic manufacturing method of the semiconductor device according to the first embodiment is schematically described.

FIG. 4A through FIG. 7A are cross-sectional views taken along the bit line direction of the semiconductor device according to the first embodiment of the invention, and FIG. 4B through FIG. 7B are cross-sectional views taken along the word line direction of the semiconductor device according to the first embodiment of the invention.

Figure 4B:
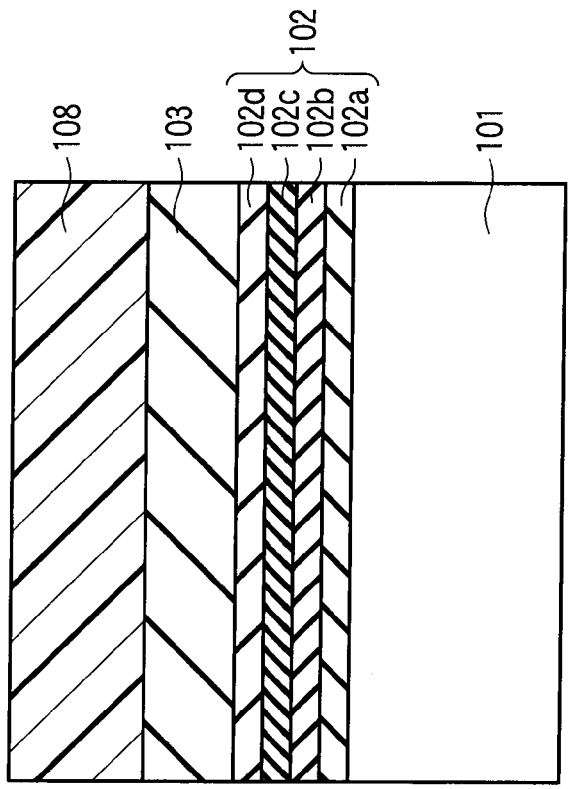
FIG. 4B is a cross-sectional view taken along the word line direction of the semiconductor device according to the first embodiment of the invention.
Figure 4A:
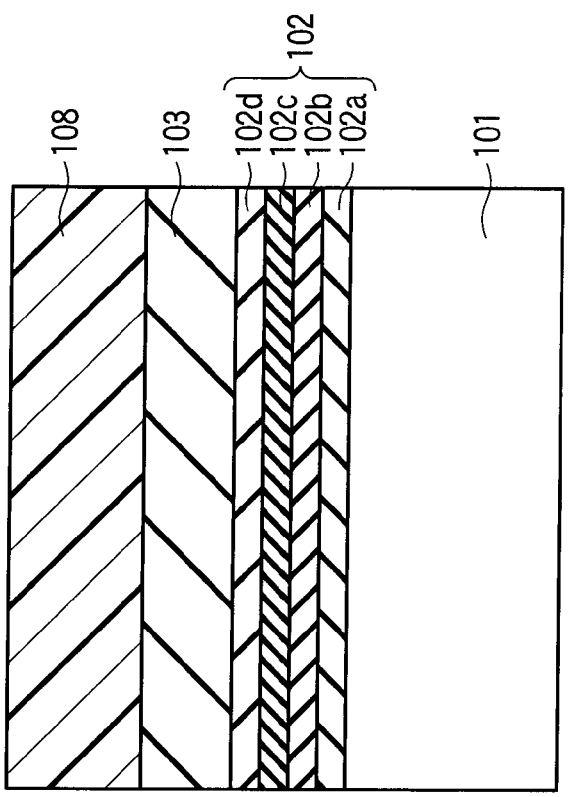
FIG. 4A is a cross-sectional view taken along the bit line direction of the semiconductor device according to the first embodiment of the invention.

First, as shown in FIG. 4A and FIG. 4B, the surface of a semiconductor substrate 101, in which desired impurities are doped, is exposed to an oxygen atmosphere at 700° C. Thereby, a silicon oxide film with a thickness of about 1.5 nm is formed as an oxide film (first region) 102a. In the meantime, the oxide film 102a may be formed by CVD. As regards the conditions for forming the oxide film 102a by CVD, for example, dicyclosilane and nitrous oxide gas is used as a material gas, and the temperature for film formation is set at 600° C. to 850° C.

Subsequently, a silicon nitride film with a thickness of about 3.5 nm is deposited by ALD (Atomic Layer Deposition). Thereafter, at least a surface region of the silicon nitride film is oxidized in an atmosphere containing an oxygen radical at a substrate temperature of 700° C., and a silicon nitride film and a silicon oxynitride film having a nitrogen concentration distribution as shown in FIG. 2 are formed as a nitride film (second region) 102b and an oxynitride film (fourth region) 102c. In the meantime, the silicon nitride film may be formed by CVD. As regards the conditions for forming the nitride film 102b by CVD, for example, dichlorsilane and nitrous oxide gas is used as a material gas, and the film formation is performed in a furnace at 600° C. to 850° C. Then, using dichlorsilane and ozone gas, ALD is performed at a substrate temperature of 550° C., and a silicon oxide film with a thickness of about 0.5 nm is deposited as an oxide film (third region) 102d. In the meantime, the oxide film 102d may be formed by CVD. As regards the conditions for forming the oxide film 102d by CVD, for example, dichlorsilane and nitrous oxide gas is used as a material gas, and the film formation is performed in a furnace at 600° C. to 850° C.

In this manner, the tunnel insulating film 102 having the multilayer structure with a thickness of about 6 nm, which comprises the oxide film 102a, nitride film 102b, oxynitride film 102c and oxide film 102d, is formed.

Subsequently, using CVD, a silicon nitride film with a thickness of about 5 nm, which becomes a charge-storage insulating film 103, is deposited. Further, a process mask material 108 is deposited on the charge-storage insulating film 103 by CVD.

Next, as shown in FIG. 5A and FIG. 5B, by an RIE (Reactive Ion Etching) method using a resist mask (not shown), the process mask material 108, charge-storage insulating film 103 and tunnel insulating film 102 are successively etched. Further, the exposed semiconductor substrate is etched to a depth of about 100 nm, and an element isolation trench 107a is formed.

Following the above, as shown in FIG. 6A and FIG. 6B, a silicon oxide film is formed by a coating method, and the silicon oxide film is planarized by CMP (Chemical Mechanical Polishing), thereby forming an element isolation insulating film 107. Then, the process mask material 108 is removed, and an alumina film with a thickness of about 13 nm, which becomes a block insulating film 104, is deposited by ALD. Subsequently, using CVD, a polycrystalline silicon doped with impurities, which becomes a control gate electrode 105, is deposited, and a process mask material 109 is deposited on the control gate electrode 105.

Figure 7B:
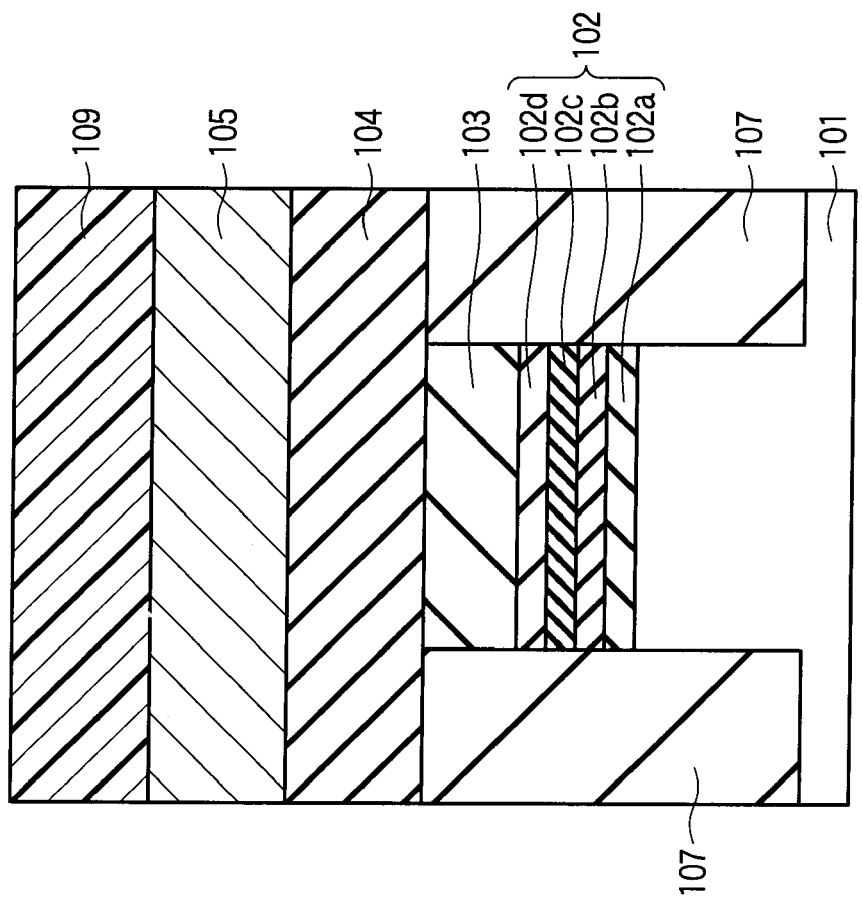
FIG. 7B is a cross-sectional view taken along the word line direction of the semiconductor device according to the first embodiment of the invention.
Figure 7A:
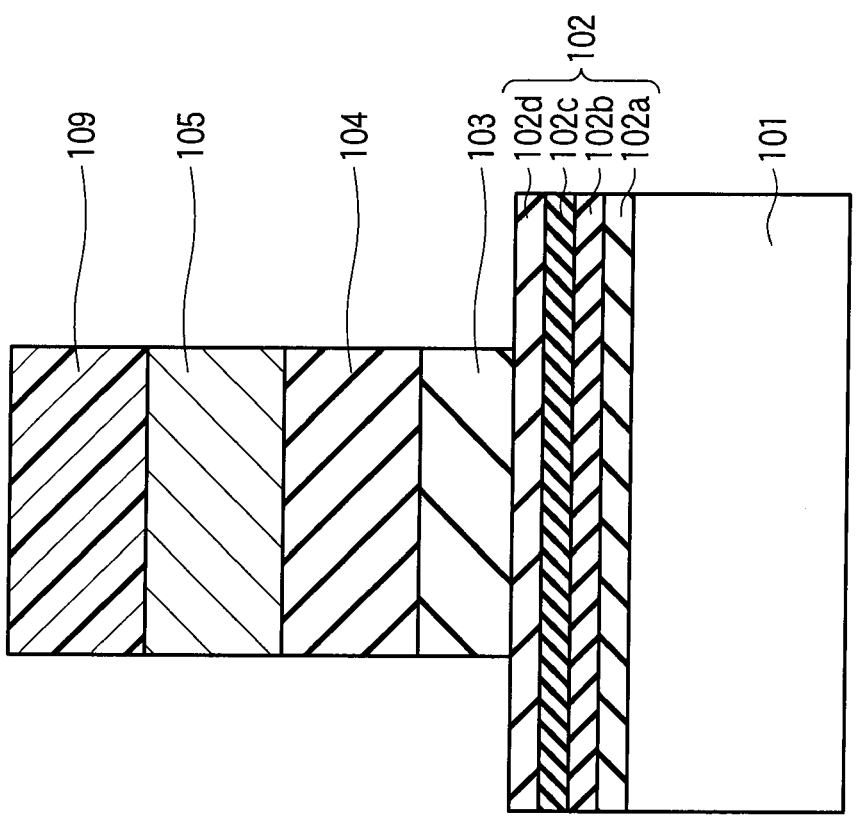
FIG. 7A is a cross-sectional view taken along the bit line direction of the semiconductor device according to the first embodiment of the invention.

Next, as shown in FIG. 7A and FIG. 7B, by an RIE method using a resist mask (not shown), the process mask material 109, control gate electrode film 105, block insulating film 104 and charge-storage insulating film 103 are successively etched, and a plurality of gate structures each having a width and an interval of about 20 nm are formed. At this time, the surface of the tunnel insulating film 102 is exposed. Then, using ion implantation and thermal anneal, impurity diffusion layers (not shown) for a source/drain are formed.

Next, as shown in FIG. 1A and FIG. 1B, the process mask material 109 is removed, and a silicon oxide film, which becomes an interlayer insulating film 106, is formed by a coating method and then planarized by CMP.

Thereafter, using well-known art, a wiring layer (not shown), etc. are formed, and a nonvolatile semiconductor memory device is completed.

According to the above-described first embodiment, by oxidizing the silicon nitride film formed on the oxide film 102a, the oxynitride film 102c having a desired nitrogen concentration distribution can be formed between the nitride film 102b and the oxide film 102d.

The formation of the silicon oxynitride film 102c prevents direct contact between the nitride film 102b and the oxide film 102d. This relaxes a stress due to the differences in inter-lattice distance and film expansion coefficient between the nitride film 102b and the oxide film 102d, which are caused by direct contact between the nitride film 102b and the oxide film 102d. In addition, defects occurring at the interface between the nitride film 102b and oxide film 102d can be reduced. Accordingly, at the time of the write operation, the number of electrons, which are trapped in the tunnel insulating film 102 when electrons are to be accumulated in the charge-storage insulating film 103 from the semiconductor substrate 101 via the tunnel insulating film 102, is decreased. Besides, at the time of the erase operation, the number of holes, which are trapped in the tunnel insulating film 102 when holes are to be injected in the charge-storage insulating film 103 from the semiconductor substrate 101 via the tunnel insulating film 102, is decreased. Therefore, it is possible to reduce the problem that trapped electrons or holes leak to the semiconductor substrate 101, and it is possible to improve the charge retention characteristics.

As a result, in the present embodiment, it is possible to obtain the memory cell transistor having good charge erase characteristics and charge retention characteristics.

Next, the basic structures of semiconductor devices according to modifications of the first embodiment are schematically described with reference to FIG. 8, FIG. 9A, FIG. 9B, FIG. 10, FIG. 11A, FIG. 11B, FIG. 12, FIG. 13A and FIG. 13B. In each of these Figures, a nitrogen concentration distribution (A) is a distribution in the case where the nitrogen concentration decreases at a constant ratio. A distribution (B) is a distribution in the case where the quantity of nitrogen is greater and the quantity of oxygen is smaller than in the case of the distribution (A). A distribution (C) is a distribution in the case where the quantity of nitrogen is smaller and the quantity of oxygen is greater than in the case of the distribution (A).

(Modification 1)

Figure 8:
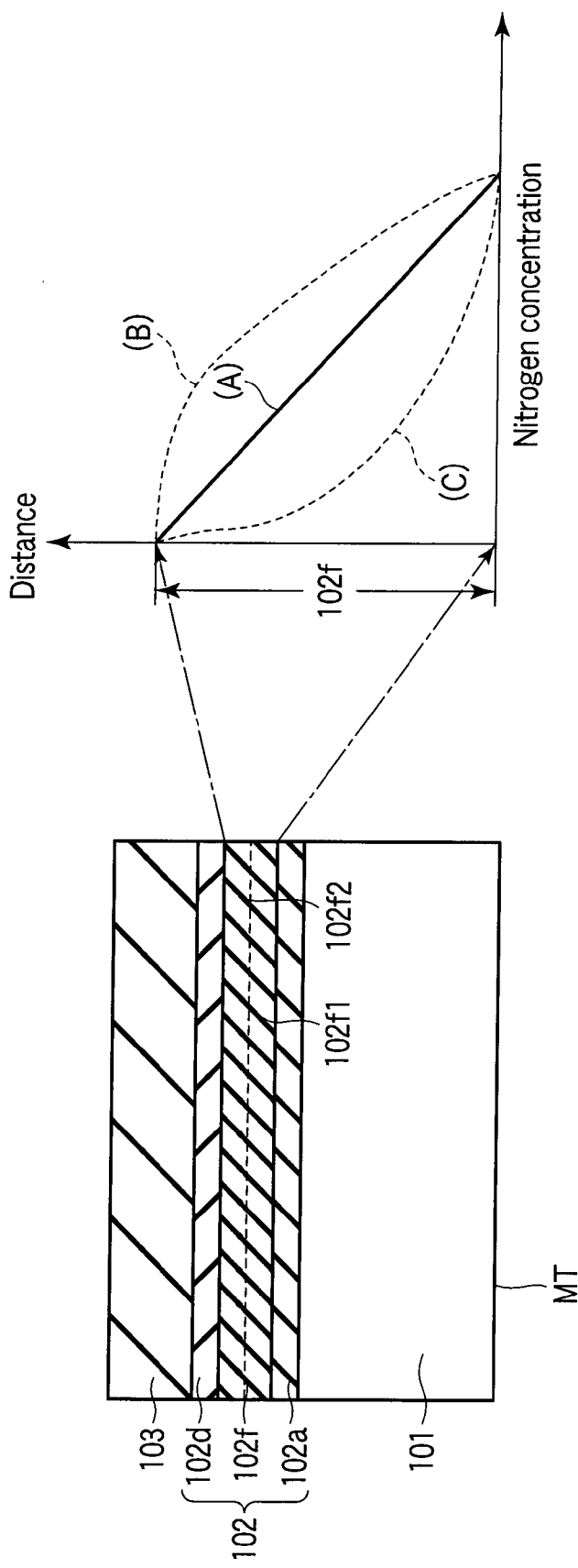
FIG. 8 shows a cross-sectional view which schematically shows the structure of a tunnel insulating film of Modification 1 of the first embodiment of the invention, and a nitrogen concentration distribution in the depth direction of an oxynitride film.

FIG. 8 shows a cross-sectional view which schematically shows the structure of a tunnel insulating film 102 of Modification 1 of the first embodiment of the invention, and a nitrogen concentration distribution in the depth direction of an oxynitride film 102f.

As shown in FIG. 8, in Modification 1, like the above-described first embodiment, the tunnel insulating film 102 includes an oxide film 102a (first region) and an oxide film 102d (third region). The region, which corresponds to the nitride film 102b and oxynitride film 102c in the first embodiment, is formed as the oxynitride film (silicon oxynitride film) 102f. The other basic structure of Modification 1 is the same as that of the first embodiment.

The nitrogen concentration in the oxynitride film 102f decreases from the boundary between the oxide film 102a and the oxynitride film 102f toward the boundary between the oxide film 102d and the oxynitride film 102f. Conversely, the oxygen concentration increases from the boundary between the oxide film 102a and the oxynitride film 102f toward the boundary between the oxide film 102d and the oxynitride film 102f. The region, in which the oxynitride film 102f is formed, virtually comprises two regions. The region having a nitrogen concentration of a predetermined value or more (or an oxygen concentration of a predetermined value or less) corresponds to a second region 102f1. The region having a nitrogen concentration lower than the predetermined value (or an oxygen concentration higher than the predetermined value) corresponds to a fourth region 102f2.

FIG. 9A is an energy band diagram at a time of a charge erase operation of the memory cell transistor of Modification 1 of the first embodiment of the invention, and FIG. 9B is an energy band diagram at a time after the charge erase (at a time of charge retention) of the memory cell transistor of Modification 1 of the first embodiment of the invention.

As shown in FIG. 9A, at the time of the charge erase operation, like the above-described embodiment, the barrier as shown in FIG. 3A is not present, and holes are injected in the charge-storage insulating film 103, without being trapped in the potential well. Thereby, like the first embodiment, the saturation of erase characteristics due to the hole trap can be suppressed, and good erase characteristics can be obtained.

In addition, as shown in FIG. 9B, at the time of charge retention, the oxynitride film 102f and oxide film 102d function as a barrier against holes, and therefore the degradation in charge retention characteristics can be suppressed.

(Modification 2)

Figure 10:
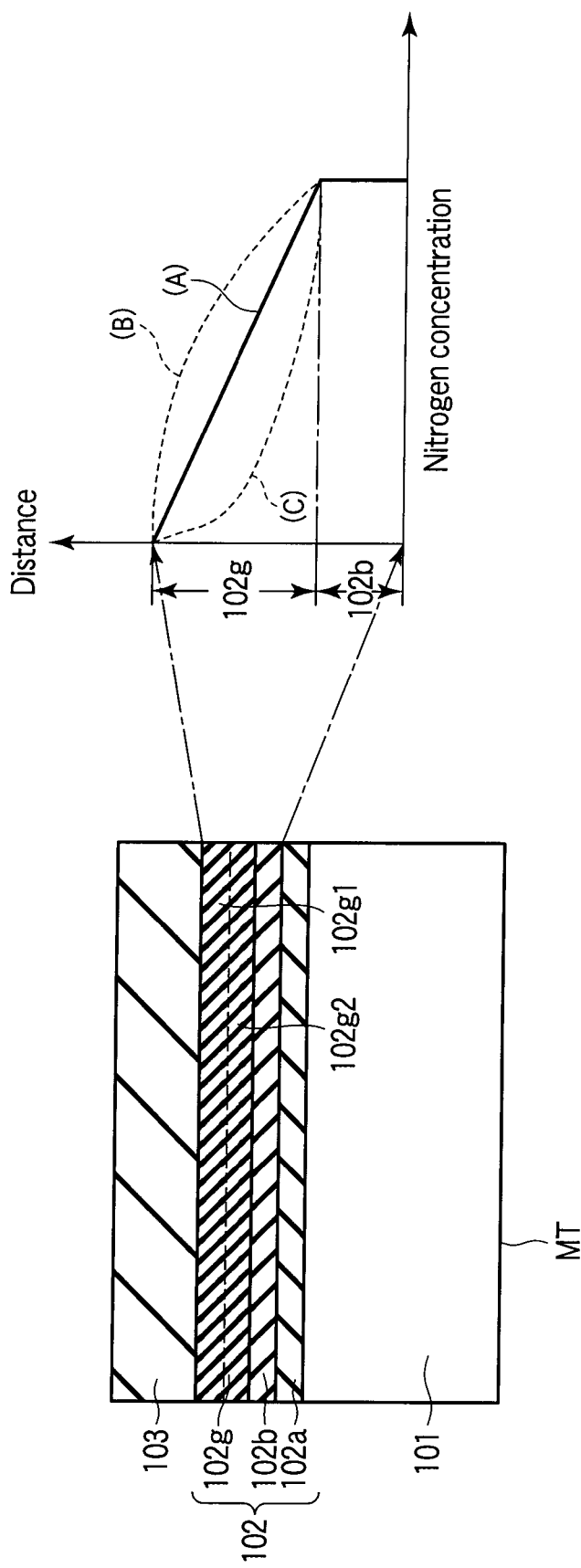
FIG. 10 shows a cross-sectional view of a tunnel insulating film in Modification 2 of the first embodiment of the invention, and a nitrogen concentration distribution in the depth direction of a nitride film and an oxynitride film.

FIG. 10 shows a cross-sectional view of a tunnel insulating film 102 in Modification 2 of the first embodiment of the invention, and a nitrogen concentration distribution in the depth direction of a nitride film 102b and an oxynitride film 102g.

As shown in FIG. 10, in Modification 2, like the above-described first embodiment, the tunnel insulating film 102 includes an oxide film 102a (first region) and a nitride film 102b (second region). The region, which corresponds to the oxynitride film 102c and oxide film 102d in the above-described first embodiment, is formed as the oxynitride film (silicon oxynitride film) 102g. The other basic structure of Modification 2 is the same as that of the first embodiment.

The nitrogen concentration in the oxynitride film 102g decreases from the boundary between the nitride film 102b and oxynitride film 102g toward the boundary between the charge-storage insulating film 103 and the oxynitride film 102g. Conversely, the oxygen concentration increases from the boundary between the nitride film 102b and oxynitride film 102g toward the boundary between the charge-storage insulating film 103 and the oxynitride film 102g. The region, in which the oxynitride film 102g is formed, virtually comprises two regions. The region having an oxygen concentration of a predetermined value or more (or a nitrogen concentration of a predetermined value or less) corresponds to a third region 102g1. The region having an oxygen concentration lower than the predetermined value (or a nitrogen concentration higher than the predetermined value) corresponds to a fourth region 102g2.

FIG. 11A is an energy band diagram at a time of a charge erase operation of the memory cell transistor of Modification 2 of the first embodiment of the invention, and FIG. 11B is an energy band diagram at a time after the charge erase (at a time of charge retention) of the memory cell transistor of Modification 2 of the first embodiment of the invention.

As shown in FIG. 11A, at the time of the charge erase operation, like the above-described embodiment, the barrier as shown in FIG. 3A is not present, and holes are injected in the charge-storage insulating film 103, without being trapped in the potential well. Thereby, like the first embodiment, the saturation of erase characteristics due to the hole trap can be suppressed, and good erase characteristics can be obtained.

In addition, as shown in FIG. 11B, at the time of charge retention, the oxynitride film 102g functions as a barrier against holes, and therefore the degradation in charge retention characteristics can be suppressed.

(Modification 3)

Figure 12:
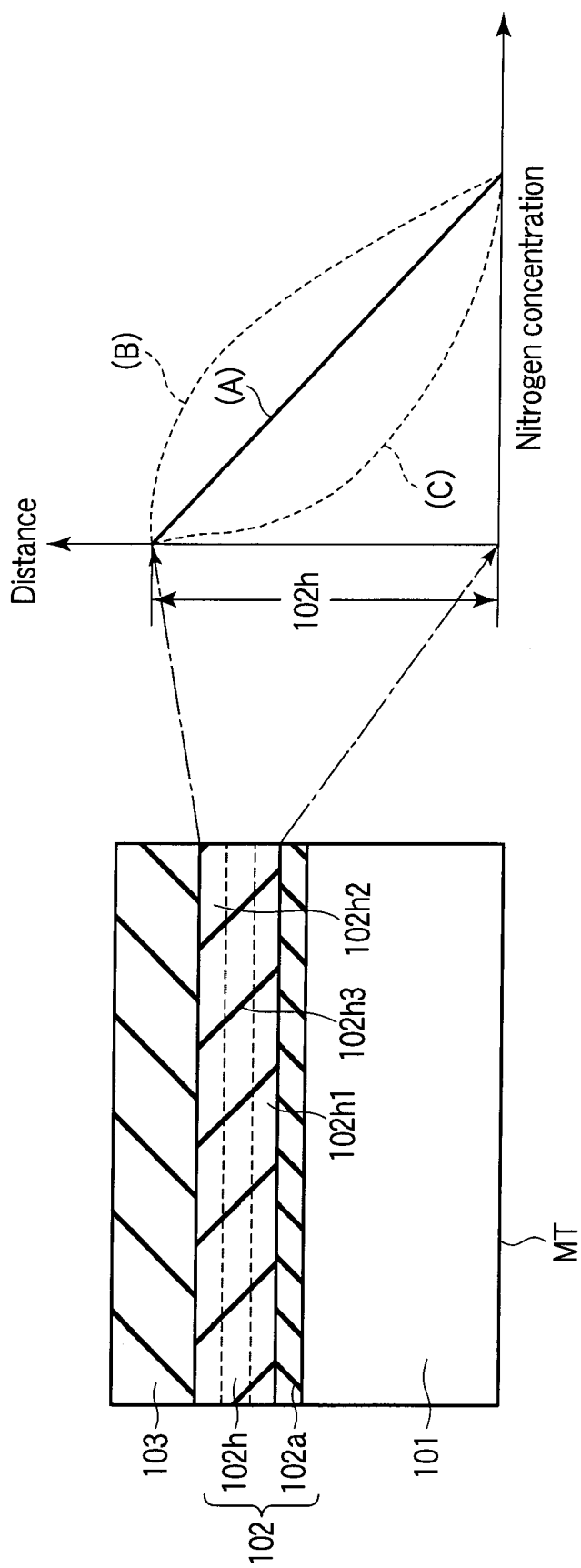
FIG. 12 shows a cross-sectional view of a tunnel insulating film in Modification 3 of the first embodiment of the invention, and a nitrogen concentration distribution in the depth direction of an oxynitride film.

FIG. 12 shows a cross-sectional view of a tunnel insulating film in Modification 3 of the first embodiment of the invention, and a nitrogen concentration distribution in the depth direction of an oxynitride film 102h.

As shown in FIG. 12, in Modification 3, like the above-described first embodiment, the tunnel insulating film 102 includes an oxide film 102a. The region, which corresponds to the nitride film 102b, oxynitride film 102c and oxide film 102d in the above-described first embodiment, is formed as the oxynitride film (silicon oxynitride film) 102*h*. The other basic structure of Modification 3 is the same as that of the first embodiment.

The nitrogen concentration in the oxynitride film 102*h* decreases from the boundary between the oxide film 102*a* and the oxynitride film 102*h* toward the boundary between the charge-storage insulating film 103 and the oxynitride film 102*h*. Conversely, the oxygen concentration increases from the boundary between the oxide film 102*a* and the oxynitride film 102*h* toward the boundary between the charge-storage insulating film 103 and the oxynitride film 102*h*. The region, in which the oxynitride film 102*h* is formed, virtually comprises three regions. The region having a nitrogen concentration of a predetermined value or more (or an oxygen concentration of a predetermined value or less) corresponds to a second region 102*h*1. The region having an oxygen concentration of a predetermined value or more (or a nitrogen concentration of a predetermined value or less) corresponds to a third region 102*h*2. The region between the second region 102*h*1 and third region 102*h*2 corresponds to a fourth region 102*h*3.

Figure 13B:
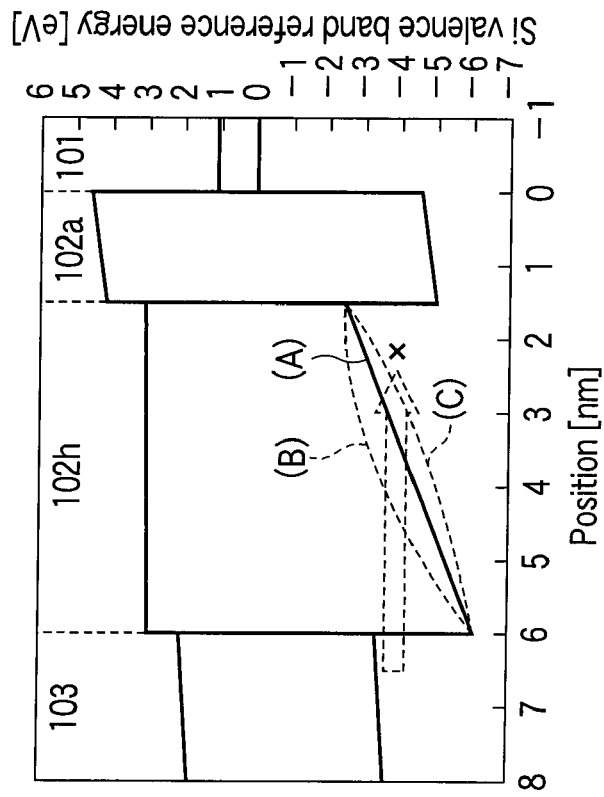
FIG. 13B is an energy band diagram at a time after the charge erase of the memory cell transistor of Modification 3 of the first embodiment of the invention.
Figure 13A:
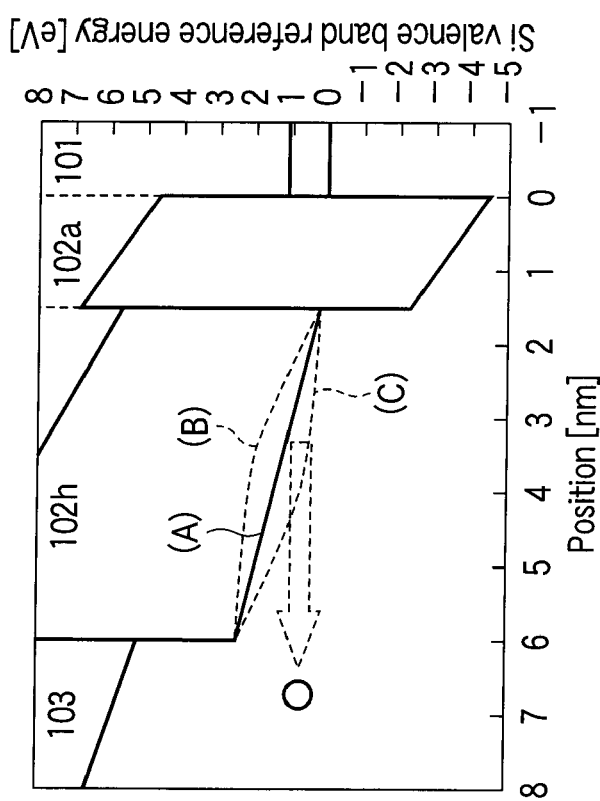
FIG. 13A is an energy band diagram at a time of a charge erase operation of the memory cell transistor of Modification 3 of the first embodiment of the invention.

FIG. 13A is an energy band diagram at a time of a charge erase operation of the memory cell transistor of Modification 3 of the first embodiment of the invention, and FIG. 13B is an energy band diagram at a time after the charge erase (a time of charge retention) of the memory cell transistor of Modification 3 of the first embodiment of the invention.

As shown in FIG. 13A, at the time of the charge erase operation, like the above-described embodiment, the barrier as shown in FIG. 3A is not present, and holes are injected in the charge-storage insulating film 103, without being trapped in the potential well. Thereby, like the first embodiment, the saturation of erase characteristics due to the hole trap can be suppressed, and good erase characteristics can be obtained.

In addition, as shown in FIG. 13B, at the time of charge retention, the oxynitride film 102*h* functions as a barrier against holes, and therefore the degradation in charge retention characteristics can be suppressed.

In each of the above-described Modifications, the silicon nitride film, which is formed on the oxide film 102*a*, is oxidized by controlling the amount of oxidation. Thereby, the silicon oxynitride films having the nitrogen concentration distributions as shown in FIG. 8, FIG. 10 and FIG. 12 can be formed.

In addition, the oxidation temperature at the time of oxidizing the silicon nitride film formed on the oxide film 102*a* is controlled from low temperatures to high temperatures (700° C. or above). Thereby, the silicon oxynitride films having the nitrogen concentration distributions as indicated by (B), (A) or (C) in FIG. 2, FIG. 8, FIG. 10 and FIG. 12 can be formed.

In the above-described embodiment, by oxidizing the nitride film, the oxynitride film having the desired nitrogen concentration distribution is formed.

However, an oxynitride film having a desired nitrogen concentration distribution can be formed by a manufacturing method using ALD. An example of this method of formation is described below.

First, using Si source gas (e.g. $SiH_2Cl_2$), silicon for a 1-atomic layer is formed. Then, active oxygen (e.g. $O_2$ radical, O radical, $O_3$, etc.) is supplied at a flow rate x, thereby oxidizing the silicon layer. Subsequently, a nitride gas (e.g. NH radical, $NH_3$, etc.) is supplied at a flow rate y, thereby nitriding the silicon oxide film. Thus, a silicon oxynitride film is formed. Then, a silicon layer for a 1-atomic layer is formed on the oxynitride film, and by properly varying the flow rate x and flow rate y, an oxynitride film with the varied nitrogen concentration and oxygen concentration is formed. In this manner, oxynitride films with varied concentrations are deposited until a desired film thickness is obtained. Thereby, an oxynitride film having a desired nitrogen concentration distribution and a desired oxygen concentration distribution can be formed.

In the above embodiment, the nitride film 102*b* is formed by CVD. Alternatively, the nitride film 102*b* may be formed by directly subjecting the oxide film 102*a*, which is formed with a large thickness, to thermal nitridation in an ammonia gas atmosphere. In this case, since hydrogen is contained in the nitride film 102*b*, the trap density of holes decreases. Accordingly, the erasure saturation phenomenon can further be suppressed. Besides, the nitride film 102*b* may be formed by directly subjecting the oxide film 102*a*, which is formed with a large thickness, to nitridation by a plasma using a nitrogen-based gas containing hydrogen atoms, for instance, $NH_3$ gas. In the meantime, the nitride film 102*b* may be formed by nitriding the oxide film 102*a* by a plasma using a mixture gas of a noble gas and a nitride-based gas. In the case of using the plasma, nitridation at low temperatures can be performed, and thus the diffusion of nitrogen into the oxide film 102*a* can be suppressed and the increase in low-electric-field leak current can be suppressed.

Second Embodiment

Next, a description is given of the structure of a memory cell transistor of a flash memory according to a second embodiment of the invention. FIG. 14A is a cross-sectional view taken in the bit line direction of the memory cell transistor of the flash memory according to the second embodiment, and FIG. 14B is a cross-sectional view taken in the word line direction of the memory cell transistor of the flash memory according to the second embodiment.

As shown in FIG. 14A and FIG. 14B, a tunnel insulating film 102 is formed on the surface of a semiconductor substrate (silicon substrate) 101. A charge-storage insulating film 103 is formed on the surface of the tunnel insulating film 102. A block insulating film 104 is formed on the surface of the charge-storage insulating film 103. An element isolation insulating film 107 is formed between neighboring memory cell transistors MT. A channel region CH is formed on a surface of the semiconductor substrate 101, which is sandwiched between the element isolation insulating films 107. A control gate electrode 105 is formed on the surface of the block insulating film 104 and element isolation insulating film 107. A gate voltage for data write, erase and read of the memory cell transistor MT is applied to the control gate electrode 105. An interlayer insulating film 106 is formed so as to cover the memory cell transistor MT.

The tunnel insulating film 102 comprises an oxide film (first region) 102*a* which is formed on the surface of the semiconductor substrate 101; an oxynitride film (fifth region) 102*e* which is formed on the surface of the oxide film 102*a*; a nitride film (second region) 102*b* which is formed on the surface of the oxynitride film 102*e*; an oxynitride film (fourth region) 102*c* which is formed on the surface of the nitride film 102*b*; and an oxide film (third region) 102*d* which is formed on the surface of the oxynitride film 102*c*.

The oxynitride film 102*e*, as described above, is formed between the oxide film 102*a* and nitride film 102*b*. Accordingly, the oxide film 102*a* and nitride film 102*b* are not in direct contact. In addition, the oxynitride film 102*c* is formed between the nitride film 102*b* and oxide film 102*d*. Thus, the nitride film 102*b* and oxide film 102*d* are not in direct contact.

Each of the oxide film 102a and oxide film 102d is, for instance, a silicon oxide film containing silicon and oxygen as main components. The nitride film 102b is, for instance, a silicon nitride film containing silicon and nitrogen as main components. Each of the oxynitride film 102c and oxynitride film 102e is, for instance, a silicon oxynitride film containing silicon, nitrogen and oxygen as main components.

In the tunnel insulating film 102, only one of the oxynitride film 102c and oxynitride film 102e may be formed. In this case, in order to enhance the advantageous effect of the second embodiment, which will be described later, it is desirable to form only the oxynitride film 102e which is closer to the semiconductor substrate 101.

The thicknesses of the oxynitride film 102c and oxynitride film 102e may be equal or different. In the case of the latter, in order to enhance the advantageous effect of the second embodiment, which will be described later, it is desirable to make the thickness of the oxynitride film 102e greater than the thickness of the oxynitride film 102c.

FIG. 15 shows a cross-sectional view of the tunnel insulating film 102 in the second embodiment of the invention, and a nitrogen concentration distribution in the depth direction of the oxynitride film 102e, nitride film 102b and oxynitride film 102c. FIG. 16 shows a cross-sectional view of a tunnel insulating film 110 of a comparative example of the second embodiment of the invention, and a nitrogen concentration distribution in the depth direction of a nitride film 102b.

As shown in FIG. 15, in the second embodiment, it is desirable that the thickness of each of the oxynitride film 102e and oxynitride film 102c be, e.g. about 1 nm. If the nitrogen concentration of the nitride film 102b is assumed to be 1, the nitrogen concentration of each of the oxynitride film 102e and oxynitride film 102c is, e.g. 0.6, relatively. The region in which the nitrogen concentration is 0.6 is present in a range of about 1 nm, which corresponds to the thickness of each of the oxynitride film 102e and oxynitride film 102c. Specifically, the nitrogen concentration of the tunnel insulating film 102 sharply increases from the boundary between the oxynitride film 102e and oxide film 102a and from the boundary between the oxynitride film 102c and oxide film 102d, and is kept constant up to the boundary between the oxynitride film 102e and nitride film 102b and the boundary between the oxynitride film 102c and nitride film 102b. Then, the nitrogen concentration gently increases from the boundary between the oxynitride film 102e and nitride film 102b and the boundary between the oxynitride film 102c and nitride film 102b, toward a central region in film thickness of the nitride film 102b. In other words, the nitrogen concentration in the tunnel insulating film 102 in the second embodiment varies stepwise from the oxide film 102a and oxide film 102d toward the nitride film 102b.

On the other hand, as shown in FIG. 16, in the case where no oxynitride film is formed in the tunnel insulating film 102, if the nitrogen concentration of the nitride film 102b is assumed to be 1, there are regions with a nitrogen concentration of about 0.6 between the nitride film 102b and oxide film 102a and between the nitride film 102b and oxide film 102d. However, in the comparative example, the nitrogen concentration in the tunnel insulating film 102 gently increases from the boundary between the nitride film 102b and oxide film 102a and from the boundary between the nitride film 102b and oxide film 102d, toward a central region in film thickness of the nitride film 102b. Accordingly, in the comparative example, unlike the second embodiment, the nitrogen concentration does not vary stepwise.

The composition ratio between nitrogen and oxygen of each of the oxynitride films 102e and 102c should desirably be silicon:oxygen:nitrogen=3:6:4 in terms of an atomic number ratio, in the case where silicon oxide in stoichiometric composition and silicon nitride in stoichiometric composition are present in a fifty-fifty ratio. In the meantime, each of the oxynitride films 102e and 102c may be oxygen-rich or nitrogen-rich, relative to this atomic number ratio. In addition, the silicon composition ratio of each of the oxynitride films 102e and 102c may be silicon-rich or silicon-poor.

The materials of the tunnel insulating film 102 may variously be altered. For example, each of the oxide films 102a and 102d, nitride film 102b and oxynitride films 102e and 102c may be formed of a material including germanium. Concrete examples of the combination of materials may be, in place of the combination of silicon oxide film 102a/silicon oxynitride film 102e/silicon nitride film 102b/silicon oxynitride film 102c/silicon oxide film 102d, a combination of silicon-germanium oxide film/silicon-germanium oxynitride film/silicon-germanium nitride film/silicon-germanium oxynitride film/silicon-germanium oxide film, and a combination of germanium oxide film/germanium oxynitride film/germanium nitride film/germanium oxynitride film/germanium oxide film.

Next, referring to FIG. 14A and FIG. 14B, a manufacturing method of the memory cell transistor according to the present embodiment is described.

First, an oxide film (first silicon oxide film) 102a is formed on a semiconductor substrate 101 by CVD. As regards the conditions for forming the oxide film 102a by CVD, for example, dichlorsilane and nitrous oxide gas is used as a material gas, and the temperature for film formation is set at 600° C. to 850° C. In the meantime, the oxide film 102a may be formed of a thermally-oxidized film by an oxidizing atmosphere gas.

Subsequently, a silicon oxynitride film, which becomes an oxynitride film 102e, is formed on the oxide film 102a by CVD. As regards the conditions for forming the oxynitride film 102e by CVD, for example, dichlorsilane, nitrous oxide and ammonia are used as material gases, and these material gases are introduced at the same time into a reaction chamber at 600° C. to 850° C. By varying the ratio in flow rate between the dichlorsilane and ammonia, the atomic number ratio between oxygen and nitrogen in the oxynitride film 102e can be controlled.

Next, a silicon nitride film, which becomes a nitride film 102b, is formed on the oxynitride film 102e by CVD. As regards the conditions for forming the nitride film 102b by CVD, for example, dichlorsilane and nitrous oxide gas is used as a material gas, and the film formation is performed in a furnace at 600° C. to 850° C.

Subsequently, a silicon oxynitride film, which becomes an oxynitride film 102c, is formed on the nitride film 102b by CVD. The conditions for forming the oxynitride film 102c by CVD and the method of controlling the atomic number ratio are the same as in the case of the oxynitride film 102e.

Next, an oxide film 102d is formed on the oxynitride film 102c by CVD. As regards the conditions for forming the oxide film 102d by CVD, for example, dichlorsilane and nitrous oxide gas is used as a material gas, and the temperature for film formation is set at 600° C. to 850° C.

Next, a charge-storage layer 103 is formed on the oxide film 102d. As regards the conditions for forming the charge-storage layer 103, for example, trimethyl aluminum and water vapor are used as material gas, and the film formation is performed in a furnace at about 600° C. Under these conditions, the charge-storage layer 103, which is composed of an aluminum oxide film, is formed.

Thereafter, using a generally known method, a block insulating film 104, an element isolation insulating film 107, a control gate electrode 105 and an interlayer insulating film 106 are formed.

As regards the above-described oxynitride film 102e and oxynitride film 102c, the materials and the method of formation are not limited and may be variously altered. In the above description, the oxynitride film 102e and oxynitride film 102c are formed by CVD with use of dichlorsilane, ammonia and nitrous oxide. As the silicon material gas, the dichlorsilane may be replaced with monosilane or disilane. In addition, as the oxygen material gas, the nitrous oxide may be replaced with, for instance, oxygen, ozone, or nitrogen monoxide. Besides, as the formation method, the CVD method may be replaced with, for instance, an ALD method in which 1-atom layers are deposited one by one.

The oxynitride film 102e may also be formed by nitriding the oxide film 102a. Specifically, after the oxide film 102a is formed, ammonia, nitrogen monoxide or nitrous oxide is subjected to heat treatment at about 500° C. to 1100° C. By this heat treatment, the surface of the oxide film 102a is nitrided, and the oxynitride film 102e can be formed. Alternatively, after the oxide film 102a is formed, nitrogen or ammonia is excited by microwaves or the like, and the generated nitrogen or ammonia radical is introduced into a reaction chamber. By this process, the surface of the oxide film 102a is nitrided, and the oxynitride film 102e can be formed.

On the other hand, the oxynitride film 102c may also be formed by oxidizing the nitride film 102b. Specifically, after the nitride film 102b is formed, a gas containing an oxidizing gas such as oxygen or water vapor is introduced into a reaction chamber and subjected to heat treatment at about 600° C. to 1100° C. By this heat treatment, the surface of the nitride film 102b is oxidized, and the oxynitride film 102c can be formed. Alternatively, after the nitride film 102b is formed, an oxidizing gas, such as oxygen or nitrogen monoxide, is excited by microwaves or the like, and the generated oxidizing radical is introduced into a reaction chamber. By this process, the surface of the nitride film 102b is nitrided, and the oxynitride film 102c can be formed.

According to the second embodiment, the oxynitride film 102e is formed between the nitride film 102b and oxide film 102a, and the oxynitride film 102c is formed between the nitride film 102b and oxide film 102d.

The presence of the oxynitride film 102e and oxynitride film 102c prevents direct contact between the nitride film 102b and the oxide film 102a and direct contact between the nitride film 102b and the oxide film 102d. Thereby, it is possible to relax a stress due to the differences in inter-lattice distance and film expansion coefficient between the silicon nitride film 102b and silicon oxide film 102a and between the silicon nitride film 102b and silicon oxide film 102d, which are caused by direct contact between the silicon nitride film 102b and the silicon oxide film 102a and direct contact between the silicon nitride film 102b and the silicon oxide film 102d. In addition, it is possible to reduce defects occurring at the interface between the silicon nitride film 102b and silicon oxide film 102a and the interface between the silicon nitride film 102b and silicon oxide film 102d. Accordingly, at the time of the write operation, the number of electrons, which are trapped in the tunnel insulating film 102 when electrons are to be accumulated in the charge-storage layer 103 from the semiconductor substrate 101 via the tunnel insulating film 102, is decreased. Besides, at the time of the erase operation, the number of holes, which are trapped in the tunnel insulating film 102 when holes are to be injected in the charge-storage layer 103 from the semiconductor substrate 101 via the tunnel insulating film 102, is decreased. Therefore, it is possible to reduce the problem that trapped electrons or holes leak to the semiconductor substrate 101, and it is possible to improve the charge retention characteristics of the memory cell transistor MT.

In the tunnel insulating film 102, the silicon nitride film 102b is positioned between the silicon oxide film 102a and the silicon oxide film 102d. In general, a silicon nitride film has such characteristics that the silicon nitride film has a less barrier height against holes than a silicon oxide film. Thus, the formation of the silicon nitride film 102b between the silicon oxide film 102a and silicon oxide film 102d can improve the efficiency of injection of holes from the semiconductor substrate 101 into the charge-storage layer 103 via the tunnel insulating film 102.

Third Embodiment

A third embodiment of the invention relates to a nonvolatile semiconductor memory device having a 3-D structure, which is formed by using a 3-D multilayer technology BiCS (Bit Cost Scalable).

Referring to FIG. 17A, FIG. 17B, FIG. 18A and FIG. 18B, the basic structure of a semiconductor device according to the third embodiment is schematically described.

FIG. 17A is a cross-sectional view taken in the channel length direction of a memory cell transistor according to the third embodiment of the invention, and FIG. 17B is a perspective view of the memory cell transistor according to the third embodiment.

As shown in FIG. 17A and FIG. 17B, a tunnel insulating film 202 is formed on the surface, i.e. the peripheral surface, of a columnar semiconductor region (silicon region) 201. A charge-storage insulating film 203 is formed on the surface of the tunnel insulating film 202. A block insulating film 204 is formed on the surface of the charge-storage insulating film 203. A control gate electrode 205 is formed on a surface of the block insulating film 204. The block insulating film 204 and control gate electrode 205 are covered with an interlayer insulating film 206.

The tunnel insulating film 202 comprises an oxide film (first region) 202a which is formed on the surface of the semiconductor region 201; a nitride film (second region) 202b which is formed on the surface of the oxide film 202a; an oxynitride film (fourth region) 202c which is formed on the surface of the nitride film 202b; and an oxide film (third region) 202d which is formed on the surface of the oxynitride film 202c.

Each of the oxide film 202a and oxide film 202d is, for instance, a silicon oxide film containing silicon and oxygen as main components. The nitride film 202b is, for instance, a silicon nitride film containing silicon and nitrogen as main components. The oxynitride film 202c is, for instance, a silicon oxynitride film containing silicon, nitrogen and oxygen as main components.

The width of each memory cell transistor is about 50 nm, and also the interval of neighboring memory cell transistors is about 50 nm.

Figure 18B:
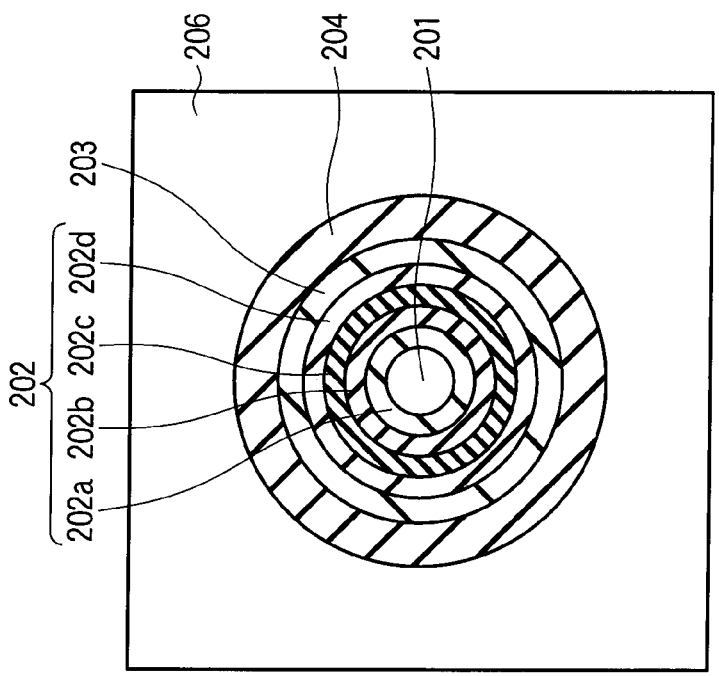
FIG. 18B is a cross-sectional view, taken in a direction perpendicular to the channel length direction, showing the structure in which the memory cell transistor according to the third embodiment of the invention is provided continuous in the vertical direction.
Figure 18A:
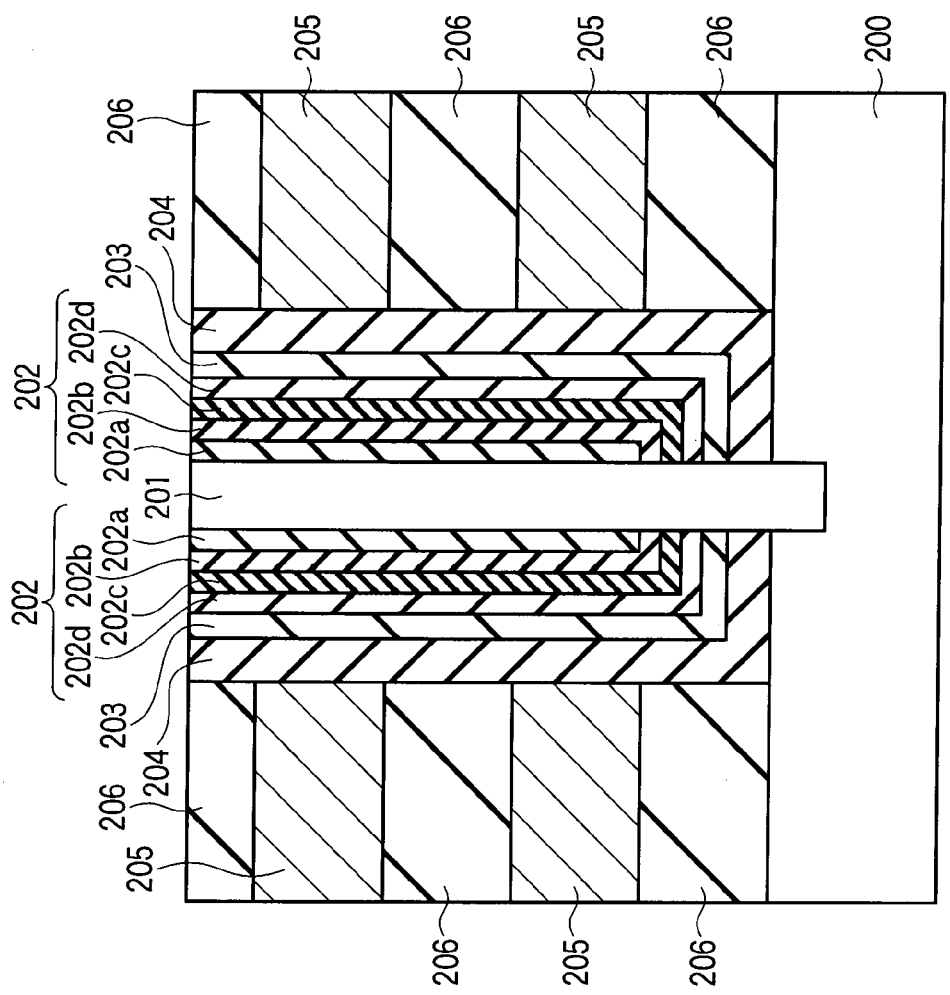
FIG. 18A is a cross-sectional view, taken in the channel length direction, showing the structure in which the memory cell transistor according to the third embodiment of the invention is provided continuous in the vertical direction.

FIG. 18A is a cross-sectional view, taken in the channel length direction, showing the structure in which the memory cell transistor according to the third embodiment of the invention is provided continuous in the vertical direction (channel length direction), and FIG. 18B is a cross-sectional view, taken in a direction perpendicular to the channel length direction, showing the structure in which the memory cell transistor according to the third embodiment of the invention is provided continuous in the vertical direction (channel length direction).

As shown in FIG. 18A and FIG. 18B, the memory cell transistors, which have been described with reference to FIG. 17A and FIG. 17B, are successively stacked on the semiconductor substrate 200.

FIG. 18A and FIG. 18B show the case in which two layers of memory cell transistors are formed. However, any number of layers of memory cell transistors may be formed, where necessary.

In the tunnel insulating film 202 of the third embodiment, like the above-described first embodiment, the oxynitride film 202c is formed between the nitride film 202b and oxide film 202d. Thus, like the first embodiment, holes are injected in the charge-storage insulating film 203, without being blocked by the barrier, and the holes are not trapped in the tunnel insulating film 202. Therefore, the saturation of erase characteristics due to the hole trap can be suppressed, and good erase characteristics can be obtained.

In addition, in the third embodiment, like the first embodiment, at the time of charge retention, the oxynitride film 202c and oxide film 202d function as a barrier against holes, and therefore the degradation in charge retention characteristics can be suppressed.

As a result, in the third embodiment, like the first embodiment, it is possible to obtain the memory cell transistor having good charge erase characteristics and charge retention characteristics.

Next, referring to FIG. 18A and FIG. 18B through FIG. 21A and FIG. 21B, a basic manufacturing method of the semiconductor device according to the third embodiment is schematically described.

FIG. 19A through FIG. 21A are cross-sectional views taken along the channel length direction of the semiconductor device according to the third embodiment of the invention, and FIG. 19B through FIG. 21B are cross-sectional views taken along a direction perpendicular to the channel length direction of the semiconductor device according to the third embodiment of the invention.

Figure 19A:
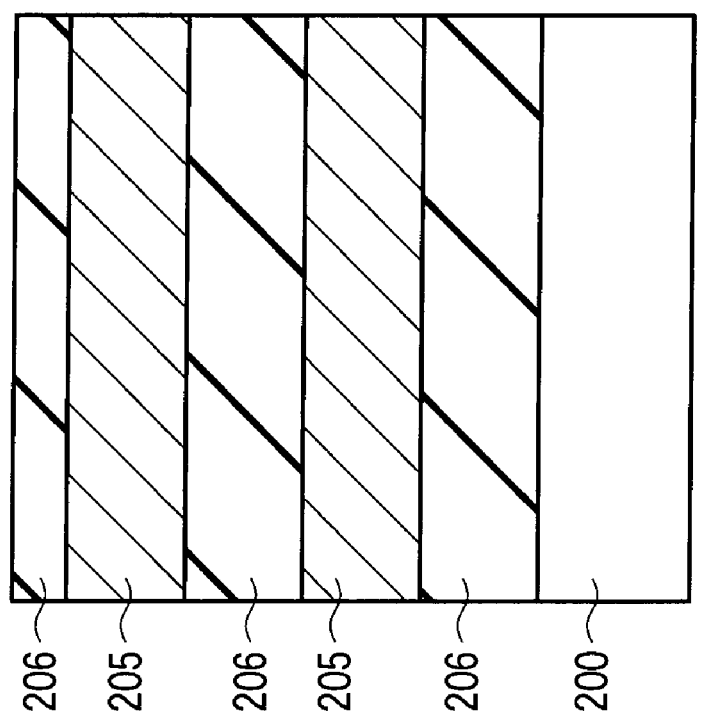
FIG. 19A is a cross-sectional view taken along the channel length direction of the semiconductor device according to the third embodiment of the invention.
Figure 19B:
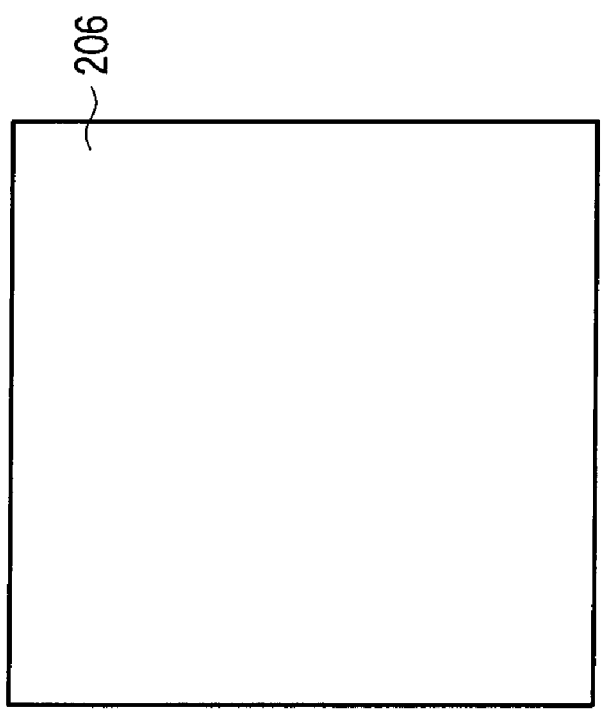
FIG. 19B is a cross-sectional view taken along a direction perpendicular to the channel length direction of the semiconductor device according to the third embodiment of the invention.

First, as shown in FIG. 19A and FIG. 19B, a silicon oxide film with a thickness of about 50 nm, which becomes an interlayer insulating film 206, and an impurity-doped silicon film with a thickness of about 50 nm, which becomes a control gate electrode 205, are alternately deposited by CVD by a desired number of times. As the material of the control gate electrode 205, for example, use may be made of a metallic material such as tantalum nitride.

Next, as shown in FIG. 20A and FIG. 20B, by an RIE method using a resist mask (not shown), the interlayer insulating film 206 and control gate electrode 205 are selectively etched away, and the semiconductor substrate 200 is exposed. Thereby, a cylindrical trench 207 with a diameter of about 60 nm is formed in the multilayer structure of the interlayer insulating films 206 and control gate electrodes 205. Thereafter, for example, an alumina film with a thickness of about 10 nm, which contains aluminum and oxygen as main components and becomes a block insulating film 204, is deposited by CVD on the inner wall of the trench 207. Alternatively, the block insulating film 204 may be, for instance, a silicon oxide film containing silicon and oxygen as main components.

Then, as shown in FIG. 21A and FIG. 21B, a silicon nitride film with a thickness of about 5 nm, which becomes a charge-storage insulating film 203, is deposited by ALD. Subsequently, a silicon oxide film with a thickness of about 4 nm is formed, and the surface of the silicon oxide film is nitrided by about 1.5 nm by a plasma using $NH_3$ gas. Thus, a silicon oxynitride film having a distribution in nitrogen concentration is formed. Thereby, the oxide film 202d and oxynitride film 202c are formed. Thereafter, a silicon oxynitride film with a thickness of about 2 nm, which becomes a nitride film 202b, is formed by ALD, and a silicon oxide film with a thickness of about 1.5 nm, which becomes an oxide film 202a, is formed by ALD. Thereby, a tunnel insulating film 202 having the multilayer structure, which comprises the oxide film 202a, nitride film 202b, oxynitride film 202c and oxide film 202d, is formed.

Next, as shown in FIG. 18A and FIG. 18B, the block insulating film 204, charge-storage insulating film 203 and tunnel insulating film 202, which are formed on the bottom portion of the trench 207, and the surface of the semiconductor substrate 200 are selectively etched away by RIE using a resist mask (not shown). Then, an impurity-doped silicon film, which becomes a channel region, is deposited by CVD and is subjected to heat treatment in a nitrogen atmosphere at about 600° C., thereby forming a semiconductor region 201. Thereafter, using well-known art, a wiring layer (not shown), etc. are formed, and a nonvolatile semiconductor memory device is completed.

According to the above-described third embodiment, by nitriding the silicon nitride film formed on the surface of the block insulating film 204, the oxynitride film 202c having a desired nitrogen concentration distribution can be formed.

As a result, in the third embodiment, like the first embodiment, it is possible to obtain the memory cell transistor having good charge erase characteristics and charge retention characteristics.

In the above-described third embodiment, the tunnel insulating film 202 has the multilayer structure which comprises the oxide film 202a, nitride film 202b, oxynitride film 202c and oxide film 202d. However, modifications, which are similar to the modifications of the first embodiment, are also applicable to the third embodiment.

In the above-described third embodiment, by nitriding the oxide film, the oxynitride film having the desired nitrogen concentration distribution is formed. However, an oxynitride film having a desired nitrogen concentration distribution can be formed by a manufacturing method using ALD. An example of this method of formation is described below.

First, using Si source gas (e.g. $SiH_2Cl_2$), silicon for a 1-atomic layer is formed. Then, active oxygen (e.g. $O_2$ radical, O radical, $O_3$, etc.) is supplied at a flow rate x, thereby oxidizing the silicon layer. Subsequently, a nitriding gas (e.g. NH radical, $NH_3$, etc.) is supplied at a flow rate y, thereby nitriding the silicon oxide film. Thus, a silicon oxynitride film is formed. Then, a silicon layer for a 1-atomic layer is formed on the oxynitride film, and by properly varying the flow rate x and flow rate y, an oxynitride film with the varied nitrogen concentration and oxygen concentration is formed. In this manner, oxynitride films with varied concentrations are deposited until a desired film thickness is obtained. Thereby, an oxynitride film having a desired nitrogen concentration distribution and a desired oxygen concentration distribution can be formed.

In the third embodiment, the oxynitride film 202c is formed by nitriding, with use of a plasma, the oxide film which is formed on the surface of the block insulating film 204. Alternatively, the oxynitride film 202c may be formed at the same time when the nitride film 202b is formed by ALD. In an example of the formation method, prior to the formation of the nitride film 202b, plasma nitridation is performed using a nitriding gas such as $NH_3$ gas, or thermal oxidation is performed at 700° C. In this case, since the oxynitride film 202c and nitride film 202b can be formed successively without contact with an outside atmosphere, no silicon oxide film is formed between the oxynitride film 202c and nitride film 202b, and the energy barrier against holes is prevented from increasing. Therefore, the erasure saturation phenomenon can further be suppressed.

In an actual nonvolatile semiconductor memory device, a plurality of memory cell transistors are arranged in the word line direction and bit line direction. A typical example of the above-described nonvolatile semiconductor memory device is a NAND type nonvolatile memory which is configured such that a plurality of series-connected memory cell transistors are provided between select transistors.

Fourth Embodiment

A fourth embodiment of the invention relates to a nonvolatile semiconductor memory device having a 3-D structure, which is formed by using a 3-D multilayer technology BiCS.

In the above-described third embodiment, like the first embodiment, a description has been given of the tunnel insulating film with the 4-layer structure comprising the silicon oxide film/silicon nitride film/silicon oxynitride film/silicon oxide film. In the fourth embodiment, like the second embodiment, the tunnel insulating film has a 5-layer structure comprising a silicon oxide film/silicon oxynitride film/silicon nitride film/silicon oxynitride film/silicon oxide film.

Referring to FIG. 22A, FIG. 22B, FIG. 23A and FIG. 23B, the basic structure of a semiconductor device according to the fourth embodiment is schematically described.

Figure 22A:
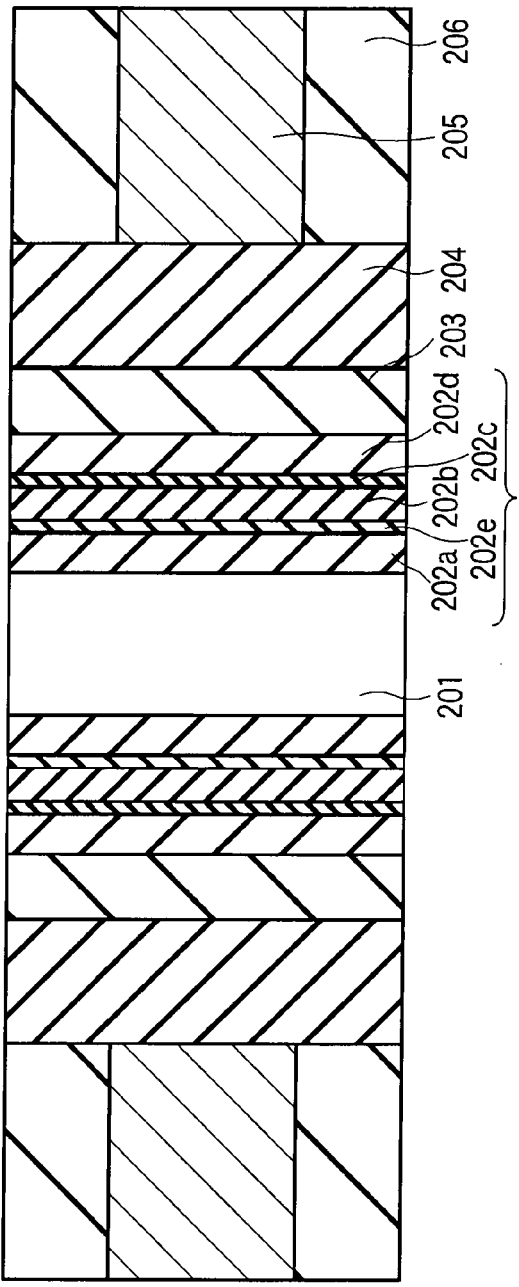
FIG. 22A is a cross-sectional view, taken along the channel length direction, showing the structure of a memory cell transistor according to a fourth embodiment of the invention.
Figure 22B:
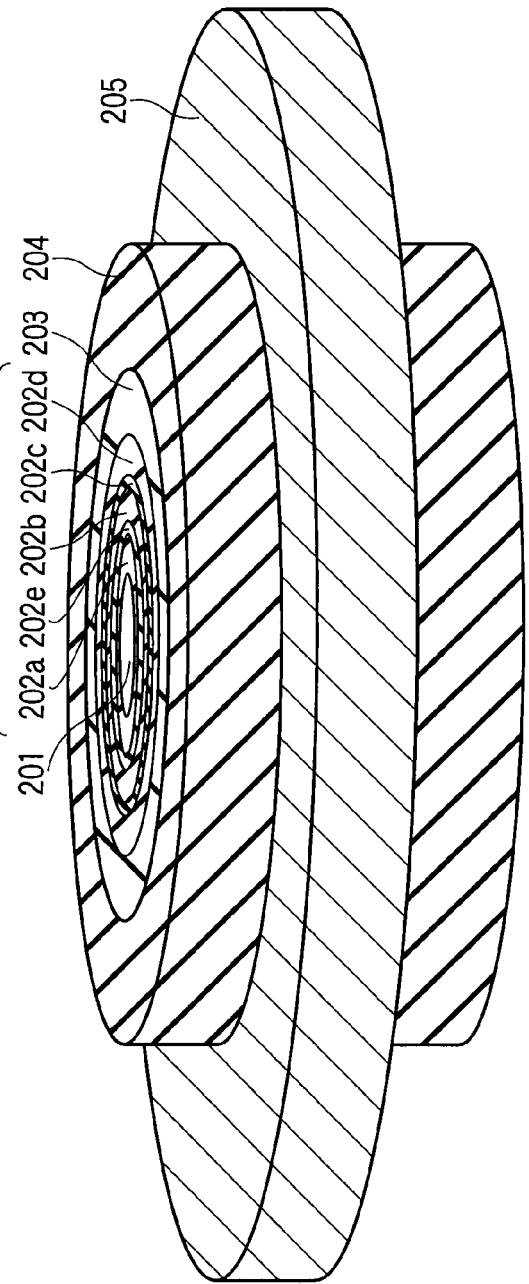
FIG. 22B is a perspective view showing the structure of the memory cell transistor according to the fourth embodiment of the invention.

FIG. 22A is a cross-sectional view, taken along the channel length direction, showing the structure of the memory cell transistor according to the fourth embodiment of the invention, and FIG. 22B is a perspective view showing the structure of the memory cell transistor according to the fourth embodiment of the invention.

As shown in FIG. 22A and FIG. 22B, a tunnel insulating film 202 is formed on the surface, i.e. the peripheral surface, of a columnar semiconductor region (silicon region) 201. A charge-storage insulating film 203 is formed on the surface of the tunnel insulating film 202. A block insulating film 204 is formed on the surface of the charge-storage insulating film 203. A control gate electrode 205 is formed on a surface of the block insulating film 204. The block insulating film 204 and control gate electrode 205 are covered with an interlayer insulating film 206.

The tunnel insulating film 202 comprises an oxide film (first region) 202a which is formed on the surface of the semiconductor region 201; an oxynitride film (fifth region) 202e which is formed on the surface of the oxide film 202a; a nitride film (second region) 202b which is formed on the surface of the oxynitride film 202e; an oxynitride film (fourth region) 202c which is formed on the surface of the nitride film 202b; and an oxide film (third region) 202d which is formed on the surface of the oxynitride film 202c.

Each of the oxide film 202a and oxide film 202d is, for instance, a silicon oxide film containing silicon and oxygen as main components. The nitride film 202b is, for instance, a silicon nitride film containing silicon and nitrogen as main components. Each of the oxynitride film 202e and oxynitride film 202c is, for instance, a silicon oxynitride film containing silicon, nitrogen and oxygen as main components.

The nitrogen concentration in the oxynitride film 202e and oxynitride film 202c is the same as those in the oxynitride film 202e and oxynitride film 202c in the second embodiment.

The width of each memory cell transistor is about 50 nm, and also the interval of neighboring memory cell transistors is about 50 nm.

Figures 23A, 23B:
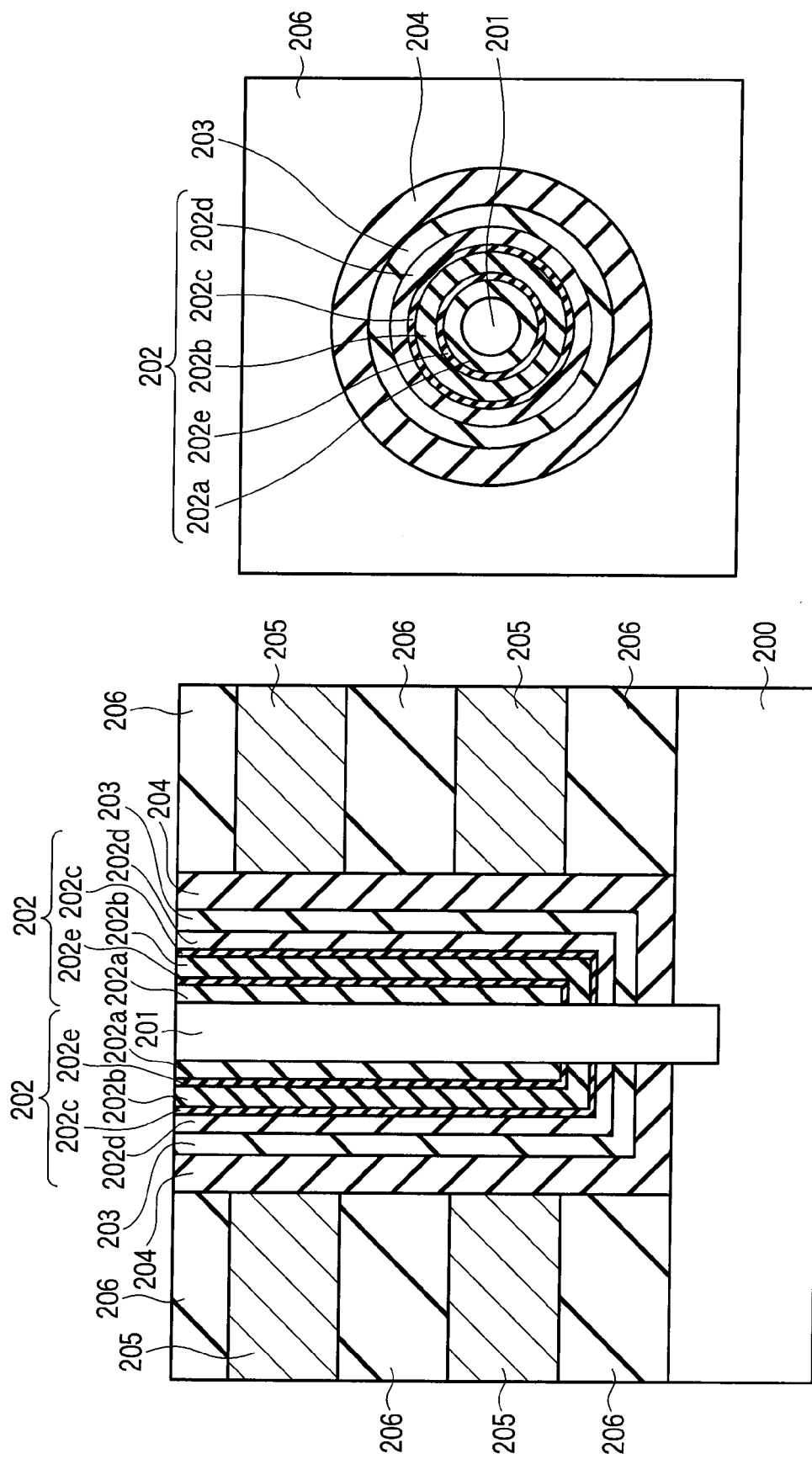
FIG. 23A is a cross-sectional view, taken in the channel length direction, showing the structure in which the memory cell transistor according to the fourth embodiment of the invention is provided continuous in the vertical direction.
FIG. 23B is a cross-sectional view, taken in a direction perpendicular to the channel length direction, showing the structure in which the memory cell transistor according to the fourth embodiment of the invention is provided continuous in the vertical direction.

FIG. 23A is a cross-sectional view, taken in the channel length direction, showing the structure in which the memory cell transistor according to the fourth embodiment of the invention is provided continuous in the vertical direction (channel length direction), and FIG. 23B is a cross-sectional view, taken in a direction perpendicular to the channel length direction, showing the structure in which the memory cell transistor according to the fourth embodiment of the invention is provided continuous in the vertical direction (channel length direction).

As shown in FIG. 23A and FIG. 23B, the memory cell transistors, which have been described with reference to FIG. 22A and FIG. 22B, are successively stacked on the semiconductor substrate 200.

FIG. 23A and FIG. 23B show the case in which two layers of memory cell transistors are formed. However, any number of layers of memory cell transistors may be formed, where necessary.

Next, referring to FIG. 23A and FIG. 23B through FIG. 26A and FIG. 26B, a basic manufacturing method of the semiconductor device according to the fourth embodiment is schematically described.

FIG. 24A through FIG. 26A are cross-sectional views taken along the channel length direction of the semiconductor device according to the fourth embodiment of the invention, and FIG. 24B through FIG. 26B are cross-sectional views taken in a direction perpendicular to the channel length direction of the semiconductor device according to the fourth embodiment of the invention.

Figure 24B:
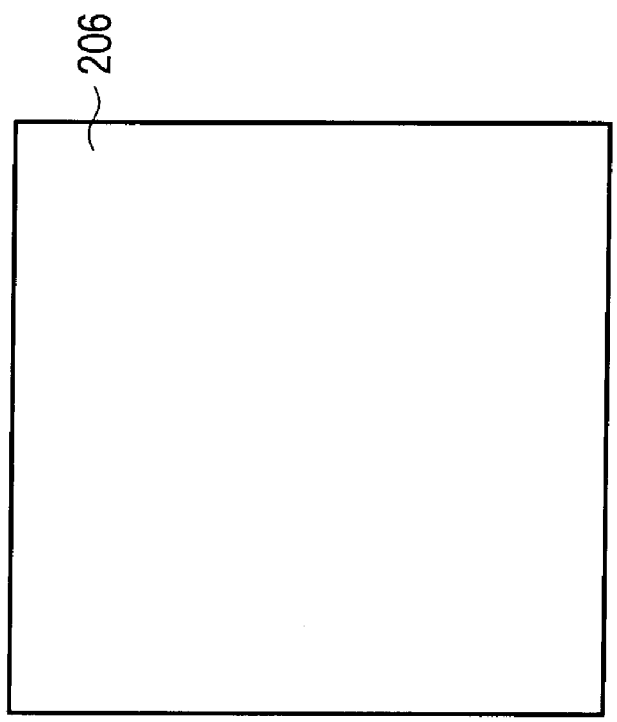
FIG. 24B is a cross-sectional view taken along a direction perpendicular to the channel length direction of the semiconductor device according to the fourth embodiment of the invention.
Figure 24A:
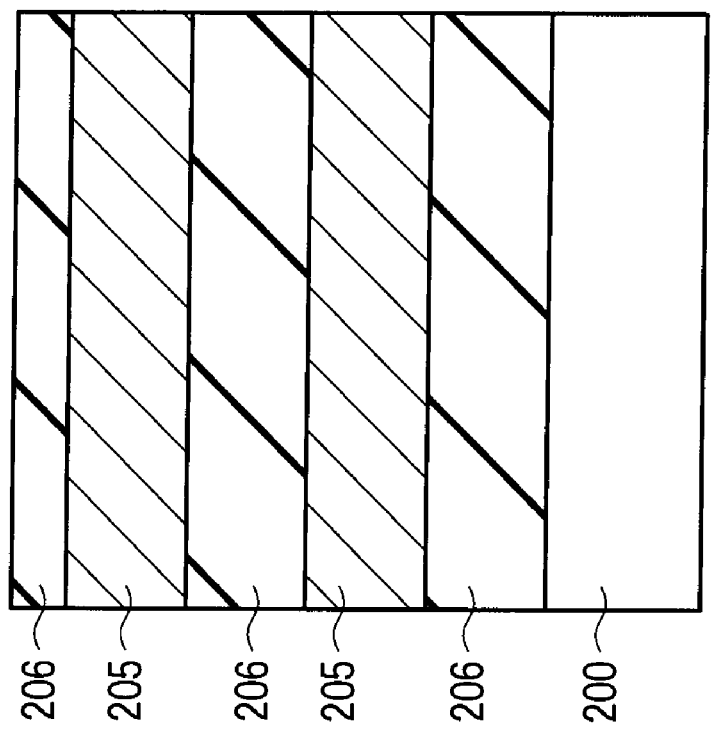
FIG. 24A is a cross-sectional view taken along the channel length direction of the semiconductor device according to the fourth embodiment of the invention.

First, as shown in FIG. 24A and FIG. 24B, a silicon oxide film with a thickness of about 50 nm, which becomes an interlayer insulating film 206, and an impurity-doped silicon film with a thickness of about 50 nm, which becomes a control gate electrode 205, are alternately deposited by CVD on the surface of the semiconductor substrate 200 by a desired number of times. As the material of the control gate electrode 205, for example, use may be made of a metallic material such as tantalum nitride.

Next, as shown in FIG. 25A and FIG. 25B, by an RIE method using a resist mask (not shown), the interlayer insulating film 206 and control gate electrode 205 are selectively etched away, and the semiconductor substrate 200 is exposed. Thereby, a cylindrical trench 207 with a diameter of about 60 nm is formed in the multilayer structure of the interlayer insulating films 206 and control gate electrodes 205. Thereafter, for example, an alumina film with a thickness of about 10 nm, which contains aluminum and oxygen as main components and becomes a block insulating film 204, is deposited by CVD on the inner wall of the trench 207. Alternatively, the block insulating film 204 may be, for instance, a silicon oxide film containing silicon and oxygen as main components.

Then, as shown in FIG. 26A and FIG. 26B, an alumina film, which becomes a charge-storage insulating film 203, is deposited. Subsequently, a silicon oxide film, which becomes an oxide film 202d, is formed, and a silicon oxynitride film, which becomes an oxynitride film 202c, is formed by CVD on the surface of the oxide film 202d. Thereafter, a silicon nitride film, which becomes a nitride film 202b, is formed by CVD, and a silicon oxynitride film, which becomes an oxynitride film 202e, is formed by CVD on the surface of the nitride film 202b. Then, a silicon oxide film, which becomes an oxide film 202a, is formed on the surface of the oxynitride film 202e. Thereby, a tunnel insulating film 202 having the multilayer structure, which comprises the oxide film 202a, oxynitride film 202e, nitride film 202b, oxynitride film 202c and oxide film 202d, is formed.

Next, as shown in FIG. 23A and FIG. 23B, the block insulating film 204, charge-storage insulating film 203 and tunnel insulating film 202, which are formed on the bottom portion of the trench 207, and the surface of the semiconductor substrate 200 are selectively etched away by RIE using a resist mask (not shown). Then, an impurity-doped silicon film, which becomes a channel region, is deposited by CVD and is subjected to heat treatment in a nitrogen atmosphere at about 600° C., thereby forming a semiconductor region 201. Thereafter, using well-known art, a wiring layer (not shown), etc. are formed, and a nonvolatile semiconductor memory device is completed.

According to the fourth embodiment, like the above-described second embodiment, the oxynitride film 202e is formed between the nitride film 202b and oxide film 202a, and the oxynitride film 202c is formed between the nitride film 202b and the oxide film 202d.

Therefore, like the second embodiment, it is possible to reduce the problem that trapped electrons or holes leak to the semiconductor substrate 101, and it is possible to improve the charge retention characteristics.

In the tunnel insulating film 202, the silicon nitride film 202b is formed between the silicon oxide film 202a and the silicon oxide film 202d. Therefore, it is possible to improve the efficiency of injection of holes from the semiconductor substrate 201 into the charge-storage layer 203 via the tunnel insulating film 202.

In the above-described embodiment, the oxynitride film is formed by CVD. However, the oxynitride film 202e can be formed by oxidizing the surface of the nitride film 202b. Specifically, after the nitride film 202b is formed, a gas containing an oxidizing gas such as oxygen or water vapor is introduced into a reaction chamber and subjected to heat treatment at about 600° C. to 1100° C. By this heat treatment, the surface of the nitride film 202b is oxidized, and the oxynitride film 202c can be formed. Alternatively, after the nitride film 202b is formed, an oxidizing gas, such as oxygen or nitrogen monoxide, is excited by microwaves or the like, and the generated oxidizing radical is introduced into a reaction chamber. By this process, the surface of the nitride film 202b is oxidized, and the oxynitride film 202c can be formed. In addition, like the above-described third embodiment, the oxynitride film 202c may be formed by oxidizing the surface of the nitride film 202b. Besides, like the third embodiment, the oxynitride films 202c and 202e can be formed by a manufacturing method using ALD.

Fifth Embodiment

A fifth embodiment of the invention relates to an example in which the charge retention characteristics of a memory cell transistor MT are improved by controlling a bias voltage at the time of a write operation and at the time of an erase operation. A description of the parts common to those in the second embodiment is omitted, and only differences are described in detail.

Figure 27:
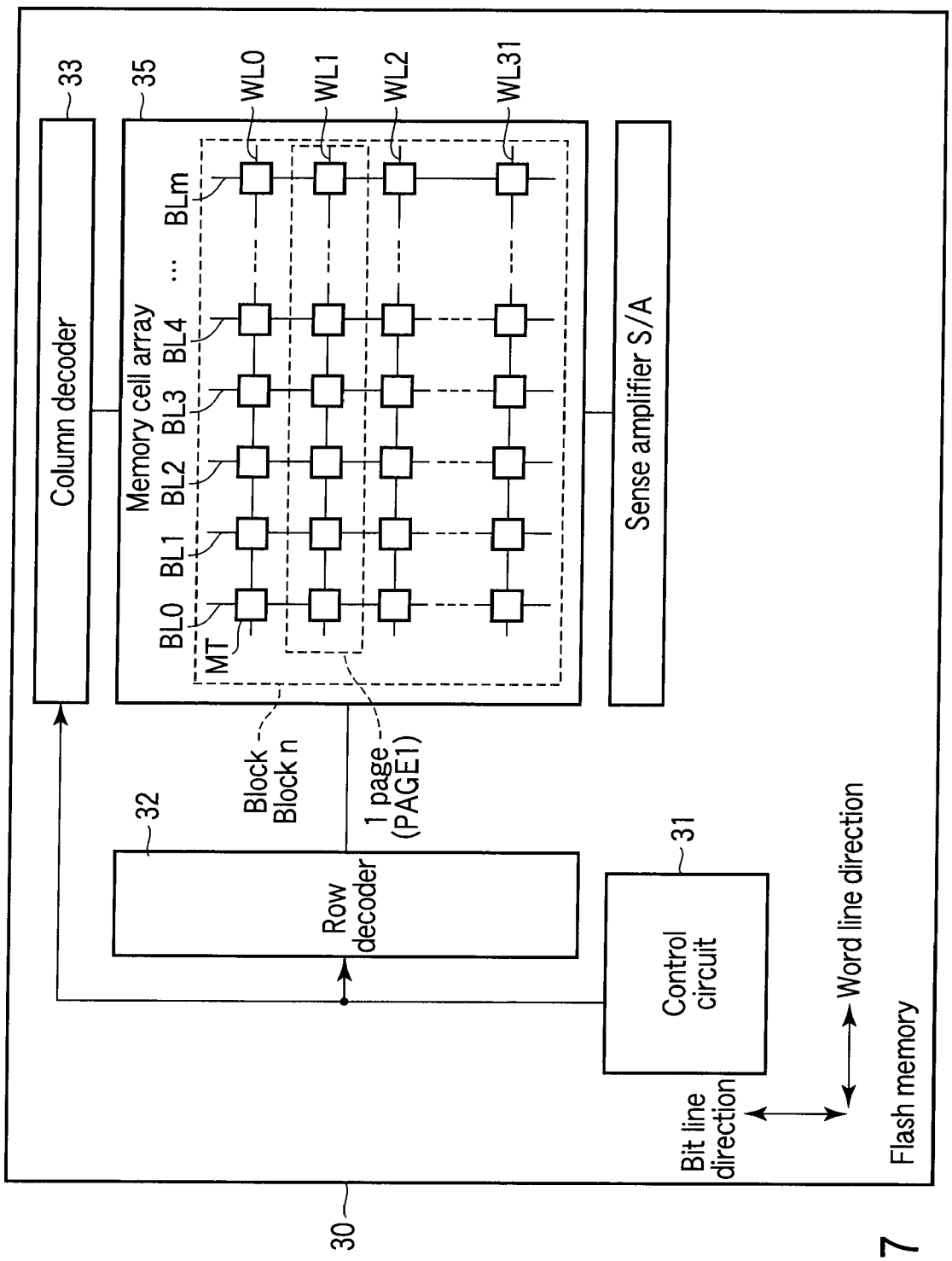
FIG. 27 is a block diagram showing a memory cell transistor in a flash memory according to a fifth embodiment of the invention.

First, the structure of a flash memory according to the present embodiment is described. FIG. 27 is a block diagram of the flash memory according to the embodiment.

As shown in FIG. 27, a flash memory 30 comprises a control circuit 31, a row decoder 32, a column decoder 33, a memory cell array 35, and a sense amplifier S/A.

The control circuit 31 is configured to control the voltage values of a gate voltage at the time of write, erase and read, and to control addresses which are selected by the row decoder 32 and column decoder 33.

The row decoder 32 is configured to select word lines WL0 to WL31 in accordance with the control of the control circuit 31.

The column decoder 33 is configured to select bit lines BL0 to BLm in accordance with the control of the control circuit 31.

The memory cell array 35 comprises a plurality of blocks (Block n-1, Block n, Block n+1, . . . ). The block (Block n) comprises a plurality of memory cell transistors MT which are arrayed in a matrix at intersections between the word lines WL0 to WL31 and the bit lines BL0 to BLm.

The sense amplifier S/A is configured to amplify the data of the memory cell transistors MT in each page, which is read out of the bit lines BL0 to BLm.

Next, the structure of the memory cell transistor of the flash memory according to the fifth embodiment is described. FIG. 28A is a cross-sectional view, taken along the word line (WL) direction, showing the memory cell transistor in the flash memory according to the present embodiment, and FIG. 28B is a cross-sectional view, taken along the bit line (BL) direction, showing the memory cell transistor in the flash memory according to the present embodiment.

Figure 28B:
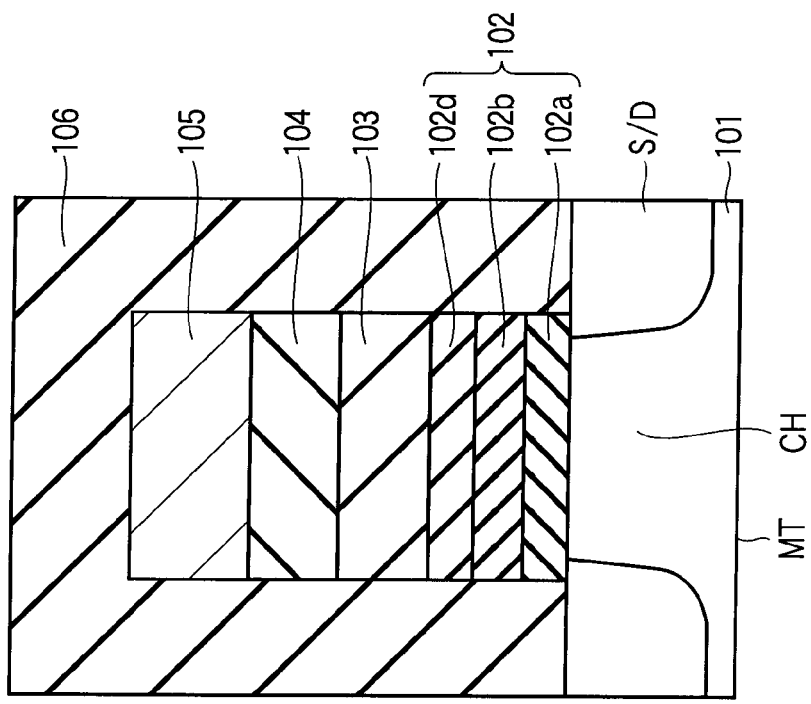
FIG. 28B is a cross-sectional view, taken along the bit line direction, showing the memory cell transistor in the flash memory according to the fifth embodiment of the invention.
Figure 28A:
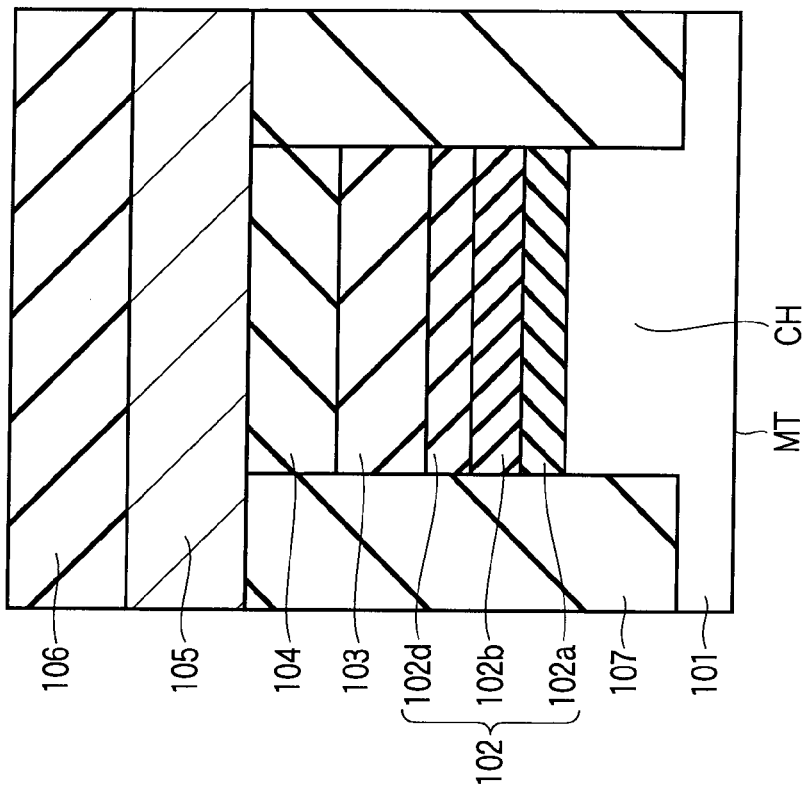
FIG. 28A is a cross-sectional view, taken along the word line direction, showing the memory cell transistor in the flash memory according to the fifth embodiment of the invention.

As shown in FIG. 28A and FIG. 28B, the fifth embodiment differs from the second embodiment in that the tunnel insulating film 102 has a 3-layer structure. Specifically, the tunnel insulating film 102 comprises an oxide film (first silicon oxide film) 102a, a nitride film (silicon nitride film) 102b and an oxide film (second silicon oxide film) 102d. The oxide film 102a is formed on the semiconductor substrate 101. The nitride film 102b is formed on the oxide film 102a. The oxide film 102d is formed on the nitride film 102b.

In the fifth embodiment, like the second embodiment, a silicon oxynitride film may be formed at least between the oxide film 102a and nitride film 102b or between the nitride film 102b and oxide film 102d.

Figure 29:
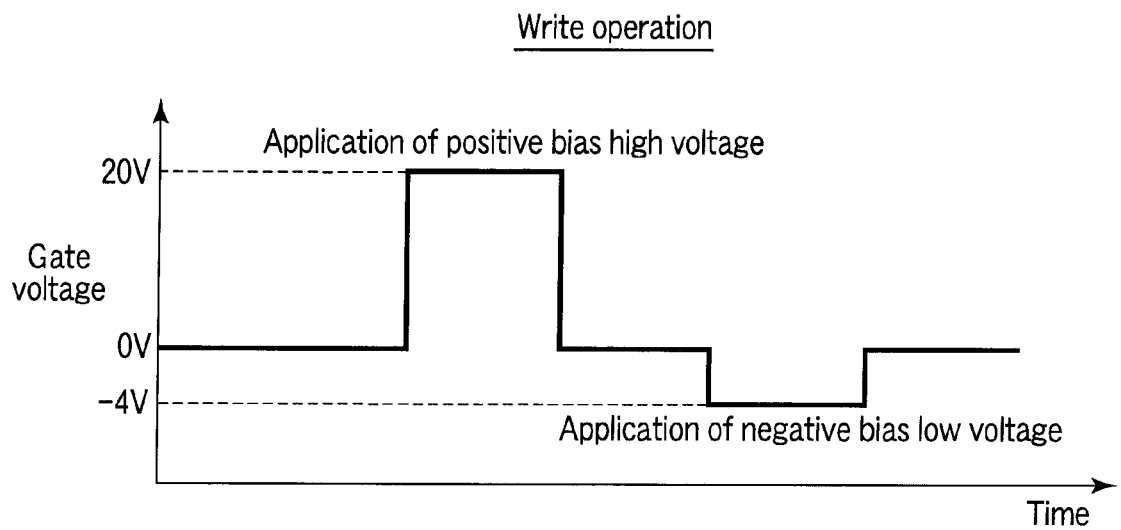
FIG. 29 is a graph showing the relationship between a gate voltage and time at a time of data write in the flash memory according to the fifth embodiment of the present invention.
Figure 30A:
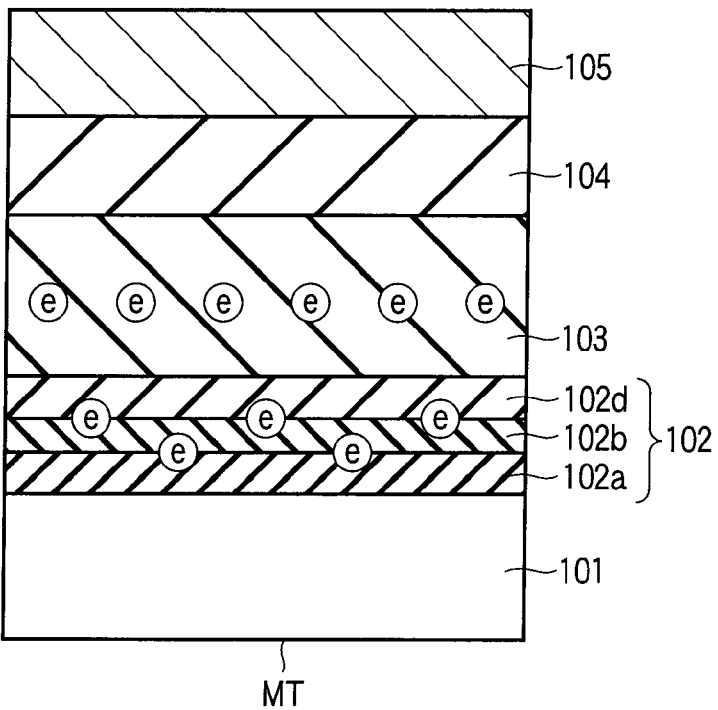
FIG. 30A is a cross-sectional view for explaining the operation of the memory cell transistor in the flash memory according to the fifth embodiment of the invention.
Figure 30B:
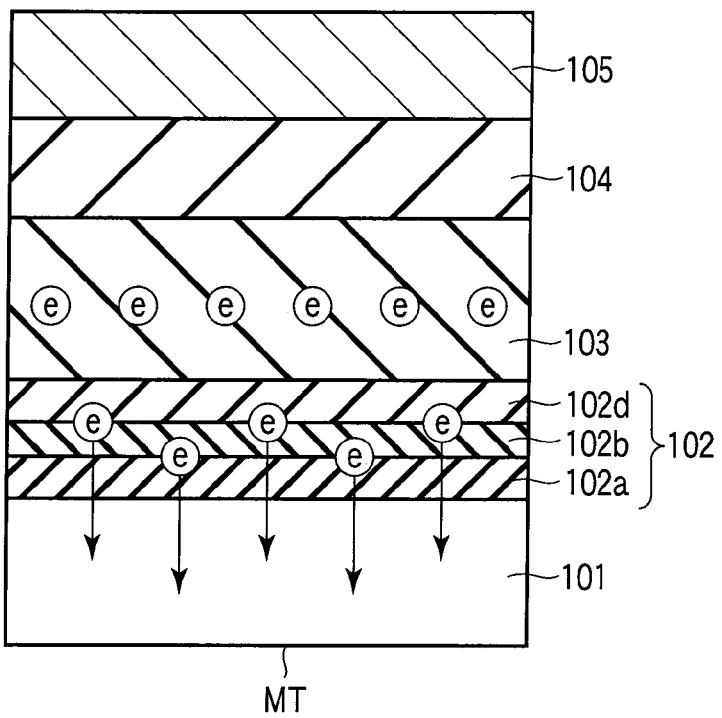
FIG. 30B is a cross-sectional view for explaining the operation of the memory cell transistor in the flash memory according to the fifth embodiment of the invention, which follows the operation shown in FIG. 30A.

Next, the write operation of the flash memory according to the fifth embodiment is described. FIG. 29 shows the variation with time of the gate voltage at a time of data write in the flash memory according to the fifth embodiment. FIG. 30A and FIG. 30B are cross-sectional views illustrating operations at the time of data write in the memory cell transistor of the flash memory according to the fifth embodiment. At the time of the write operation, the gate voltage, which is applied to the control gate electrode 105, is controlled by the control circuit 31 shown in FIG. 27.

As shown in FIG. 29, in the case where the electrical effective film thickness ($T_{eff}$) of the tunnel insulating film 102 is, e.g. 15 nm, the control circuit 31 applies, at the time of write, a positive bias voltage of, e.g. 20 V to the control gate electrode 105 for one second, and thereafter applies a negative bias voltage of, e.g. −4 V to the control gate electrode 105 for one second. Specifically, in the write operation of the fifth embodiment, after a first voltage (+V1) that is a positive bias is applied, a second voltage (−V2:|V2|<|V1|) that is a negative bias and has a smaller absolute value than the first voltage is applied.

When a positive bias voltage has been applied, as shown in FIG. 30A, electrons are accumulated in the charge-storage layer 103 from the semiconductor substrate 101 via the tunnel insulating film 102, and part of electrons are trapped in defects in the tunnel insulating film 102. However, thereafter, by the application of a negative bias voltage, as shown in FIG. 30B, the electrons trapped in the tunnel insulating film 102 are extracted to the semiconductor substrate 101 side. At this time, since the absolute value of the negative bias voltage is less than that of the previously applied positive bias voltage, the electrons in the charge-storage layer 103 are not extracted, and only the electrons trapped in the tunnel insulating film 102 are extracted.

Figure 31:
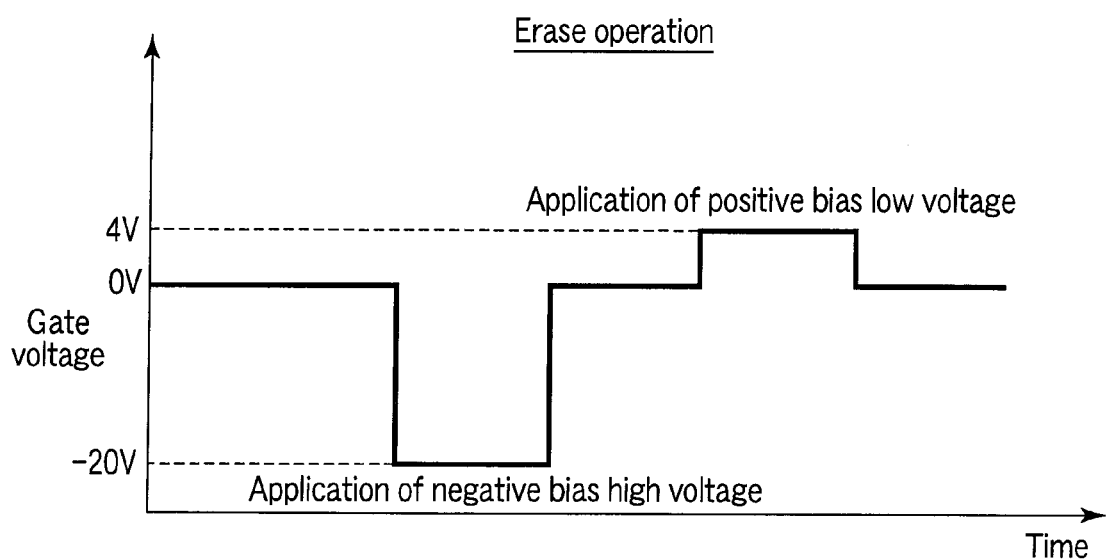
FIG. 31 is a graph showing the relationship between a gate voltage and time at a time of data erase in the flash memory according to the fifth embodiment of the present invention.

Next, the erase operation of the flash memory according to the fifth embodiment is described. FIG. 31 shows the variation with time of the gate voltage at a time of data erase in the flash memory according to the fifth embodiment. FIG. 32A and FIG. 32B are cross-sectional views illustrating operations at the time of data erase in the memory cell transistor of the flash memory according to the fifth embodiment. At the time of the erase operation, the gate voltage, which is applied to the control gate electrode 105, is controlled by the control circuit 31 shown in FIG. 27.

As shown in FIG. 31, in the case where the electrical effective film thickness ($T_{eff}$) of the tunnel insulating film 102 is, e.g. 15 nm, the control circuit 31 applies, at the time of erase, a negative bias voltage of, e.g. −20 V to the control gate electrode 105 for one second, and thereafter applies a positive bias voltage of, e.g. 4 V to the control gate electrode 105 for one second. Specifically, in the erase operation of the fifth embodiment, after a first voltage (−V3) that is a negative bias is applied, a second voltage (+V4:|V4|<|V3|) that is a positive bias and has a smaller absolute value than the first voltage is applied.

When a negative bias voltage has been applied, as shown in FIG. 32A, holes are introduced in the charge-storage layer 103 from the semiconductor substrate 101 via the tunnel insulating film 102, and part of holes are trapped in defects in the tunnel insulating film 102. However, thereafter, by the application of a positive bias voltage, as shown in FIG. 32B, electrons are introduced in the tunnel insulating film 102, and the introduced electrons and the trapped holes cancel each other. At this time, since the absolute value of the positive bias voltage is less than that of the previously applied negative bias voltage, the electrons are not injected in the charge-storage layer 103, and the electrons are injected only into the tunnel insulating film 102 and the injected electrons and the trapped holes cancel each other.

According to the fifth embodiment, the write operation and erase operation are controlled by the control circuit 31.

Specifically, in the case of the write operation, after the positive bias voltage is applied, the negative bias voltage, which has a smaller absolute value than the positive bias voltage, is applied. By executing this series of operations as the write operation, the number of electrons, which are trapped in the tunnel insulating film 102, can be reduced. Thus, it is possible to prevent the trapped electrons from leaking to the semiconductor substrate 101 after the write operation. Thereby, since the problem of degradation in threshold can be solved, the charge retention characteristics can be improved. Moreover, by executing this write operation, even if defects occur not only at the interface but also anywhere in the tunnel insulating film 102, and electrons are trapped, the trapped electrons can be extracted and the charge retention characteristics can be improved.

On the other hand, in the case of the erase operation, after the negative bias voltage is applied, the positive bias voltage, which has a smaller absolute value than the negative bias voltage, is applied. By executing this series of operations as the erase operation, the number of holes, which are trapped in the tunnel insulating film 102, can be reduced. Thus, it is possible to prevent the trapped holes from leaking to the semiconductor substrate 101 after the erase operation. Thereby, since the problem of degradation in threshold can be solved, the charge retention characteristics can be improved. Furthermore, by executing this erase operation, even if defects occur not only at the interface but also anywhere in the tunnel insulating film 102 and holes are trapped, electrons are injected to cancel the trapped holes, and thereby the charge retention characteristics can be improved.

In the write operation and erase operation in the fifth embodiment, the application time of the positive bias and the application time of the negative bias are fixed. However, these application times may be varied. For example, in the case of the write operation, after the positive bias voltage is applied, the negative bias voltage may be applied for a shorter time than the positive bias voltage. Besides, in the case of the erase operation, after the negative bias voltage is applied, the positive bias voltage may be applied for a shorter time than the negative bias voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising a semiconductor region, a tunnel insulating film formed on a surface of the semiconductor region, a charge-storage insulating film formed on a surface of the tunnel insulating film, a block insulating film formed on a surface of the charge-storage insulating film, and a control gate electrode formed on a surface of the block insulating film, wherein the tunnel insulating film comprises:
a first region which is formed on the surface of the semiconductor region and contains oxygen and at least one of silicon and germanium, as main components;
a second region which contains nitrogen and at least one of silicon and germanium, as main components;
a third region which is formed on a back surface of the charge-storage insulating film and contains oxygen and at least one of silicon and germanium, as main components; and
a fourth region which is an insulating region, between the second region and the third region, a nitrogen concentration in the fourth region being lower than a nitrogen concentration in the second region, and an oxygen concentration in the fourth region being lower than an oxygen concentration in the third region,
the second region is formed between the first region and the third region.

2. The device of claim 1, wherein the nitrogen concentration in the fourth region decreases from a boundary between the second region and the fourth region toward a boundary between the third region and the fourth region.

3. The device of claim 1, wherein the nitrogen concentration in the second region and the fourth region decreases from a boundary between the first region and the second region toward a boundary between the third region and the fourth region.

4. The device of claim 1, wherein the nitrogen concentration in the fourth region and the third region decreases from a boundary between the second region and the fourth region toward a boundary between the charge-storage insulating film and the third region.

5. The device of claim 1, wherein the nitrogen concentration in the second region, the fourth region and the third region decreases from a boundary between the first region and the second region toward a boundary between the charge-storage insulating film and the third region.

6. The device of claim 1, wherein the tunnel insulating film includes a fifth region, which is the insulating region, between the first region and the second region, a nitrogen concentration in the fifth region is lower than the nitrogen concentration in the second region, and an oxygen concentration in the fifth region is lower than the oxygen concentration in the third region.

7. A semiconductor device comprising:
- a memory cell transistor including a semiconductor region, a tunnel insulating film formed on a surface of the semiconductor region, a charge-storage insulating film formed on a surface of the tunnel insulating film, a block insulating film formed on a surface of the charge-storage insulating film, and
- a control gate electrode formed on a surface of the block insulating film; and a control circuit configured to control the memory cell transistor,
- wherein the tunnel insulating film comprises:
  - a first region which is formed on the surface of the semiconductor region and contains at least one of silicon and germanium, and oxygen, as main components;
  - a second region which contains at least one of silicon and germanium, and nitrogen, as main components; and
  - a third region which is formed on a back surface of the charge-storage insulating film and contains at least one of silicon and germanium, and oxygen, as main components, and
  - the second region is formed between the first region and the third region, and
- the control circuit is configured to apply a first voltage, which is a positive bias, to the control gate electrode, and thereafter to apply a second voltage, which is a negative bias and has a smaller absolute value than the first voltage, to the control gate electrode, in a write operation comprising a series of operations of applying the first voltage and the second voltage, and configured to apply a third voltage, which is a negative bias, to the control gate electrode, and thereafter to apply a fourth voltage, which is a positive bias and has a smaller absolute value than the third voltage, to the control gate electrode, in an erase operation comprising a series of operations of applying the third voltage and the fourth voltage.

8. The device of claim 7, wherein the tunnel insulating film includes an insulating region which is formed at least one of a region between the second region and the first region and a region between the second region and the third region, and contains at least one of silicon and germanium, nitrogen and oxygen.

9. The device of claim 8, wherein the insulating region which contains at least one of silicon and germanium, nitrogen and oxygen is formed only between the second region and the first region.

10. The device of claim 8, wherein a nitrogen concentration in the insulating region which contains at least one of silicon and germanium, nitrogen and oxygen is lower than a nitrogen concentration in the second region and higher than a nitrogen concentration in each of the first region and the third region, and a nitrogen concentration in the tunnel insulating film varies stepwise toward the second region.

11. A method of manufacturing a semiconductor device comprising a semiconductor region, a tunnel insulating film formed on a surface of the semiconductor region, a charge-storage insulating film formed on a surface of the tunnel insulating film, a block insulating film formed on a surface of the charge-storage insulating film, and a control gate electrode formed on a surface of the block insulating film,
- wherein the tunnel insulating film comprises a first region which is formed on the surface of the semiconductor region and contains at least one of silicon and germanium, and oxygen, as main components; a second region which contains at least one of silicon and germanium, and nitrogen, as main components; a third region which is formed on a back surface of the charge-storage insulating film and contains at least one of silicon and germanium, and oxygen, as main components; and an insulating region which is formed at least one of a region between the first region and the second region and a region between the second region and the third region, and contains at least one of silicon and germanium, nitrogen and oxygen, the insulating region having a lower nitrogen concentration than the second region and a lower oxygen concentration than the third region, and
- a formation of the insulating region is performed at least one of a formation between a formation of the first region and a formation of the second region, and a formation between a formation of the second region and a formation of the third region.

12. The method of claim 11, wherein the insulating region is formed by oxidizing a surface of the third region or a surface of the first region.

13. The method of claim 11, wherein the insulating region is formed by nitriding a surface of the second region.

14. The method of claim 11, wherein the insulating region is formed by an ALD method.

15. A semiconductor device comprising a semiconductor region, a tunnel insulating film formed on a surface of the semiconductor region, a charge-storage insulating film formed on a surface of the tunnel insulating film, a block insulating film formed on a surface of the charge-storage insulating film, and a control gate electrode formed on a surface of the block insulating film,
- wherein the tunnel insulating film comprises:
  - a first region which is formed on the surface of the semiconductor region and contains oxygen and at least one of silicon and germanium, as main components;
  - a second region which contains nitrogen and at least one of silicon and germanium, as main components;
  - a third region which is formed on a back surface of the charge-storage insulating film and contains oxygen and at least one of silicon and germanium, as main components; and
  - a fourth region, which is an insulating region, between the first region and the second region, a nitrogen concentration in the fourth region being lower than a nitrogen concentration in the second region, and an oxygen concentration in the fourth region being lower than an oxygen concentration in the third region;
  - the second region being formed between the first region and the third region.

* * * * *

UNITED STATES PATENT AND TRADEMARK OFFICE
CERTIFICATE OF CORRECTION

PATENT NO. : 8,254,175 B2  Page 1 of 1
APPLICATION NO. : 12/638836
DATED : August 28, 2012
INVENTOR(S) : Higuchi et al.

It is certified that error appears in the above-identified patent and that said Letters Patent is hereby corrected as shown below:

Claim 10, column 25, line 55, change "device of claim 8" to --device of claim 9--.

Signed and Sealed this
Sixth Day of November, 2012

David J. Kappos
*Director of the United States Patent and Trademark Office*